United States Patent
Huang et al.

(10) Patent No.: US 11,727,972 B2
(45) Date of Patent: Aug. 15, 2023

(54) SRAM WITH TRACKING CIRCUITRY FOR REDUCING ACTIVE POWER

(71) Applicant: TAIWAN SEMICONDUCTOR MANUFACTURING COMPANY, LTD., Hsinchu (TW)

(72) Inventors: Tsung-Hsien Huang, Hsinchu (TW); Wei-Jer Hsieh, Hsinchu (TW); Yu-Hao Hsu, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 35 days.

(21) Appl. No.: 17/459,624

(22) Filed: Aug. 27, 2021

(65) Prior Publication Data

US 2023/0064595 A1    Mar. 2, 2023

(51) Int. Cl.
*G11C 7/12* (2006.01)
*G11C 8/18* (2006.01)
*H03K 19/017* (2006.01)
*G11C 11/413* (2006.01)
*G11C 11/419* (2006.01)
*G11C 11/412* (2006.01)
*G11C 8/08* (2006.01)
*G11C 7/22* (2006.01)

(52) U.S. Cl.
CPC ............. *G11C 8/18* (2013.01); *G11C 8/08* (2013.01); *G11C 11/412* (2013.01); *G11C 11/413* (2013.01); *G11C 11/419* (2013.01); *H03K 19/01742* (2013.01); *G11C 7/12* (2013.01); *G11C 7/227* (2013.01)

(58) Field of Classification Search
CPC .......... G11C 8/18; G11C 8/08; G11C 11/412; G11C 11/413; G11C 11/419; G11C 7/12; G11C 7/227; H03K 19/01742
See application file for complete search history.

(56) References Cited

U.S. PATENT DOCUMENTS

| 9,111,595 | B2* | 8/2015 | Hsu | ........................ G11C 7/06 |
| 9,142,274 | B2* | 9/2015 | Cheng | ................... G11C 7/227 |
| 2014/0119101 | A1* | 5/2014 | Wang | ..................... G11C 16/04 365/154 |

(Continued)

FOREIGN PATENT DOCUMENTS

CN          113808646 A  * 12/2021  ......... G11C 11/4074

*Primary Examiner* — Mushfique Siddique
(74) *Attorney, Agent, or Firm* — Birch, Stewart, Kolasch & Birch, LLP

(57) ABSTRACT

A memory device is disclosed. The memory device includes word lines, a tracking bit line and a word line driver. The word lines are configured to transmit word line signals to memory cells. The tracking bit line is coupled to a first plurality of tracking cells that are arranged in rows. The word line driver is coupled to the word lines and a control circuit that is coupled through the tracking bit line to the word lines. The word line driver is configured to control a falling edge of each of the word line signals, by receiving each corresponding tracking bit line signal of tracking bit line signals transmitted from the tracking bit line, based on a resistance of a length of the tracking bit line. The length is substantially distanced from each corresponding row of the rows to the control circuit. A method is also disclosed herein.

20 Claims, 10 Drawing Sheets

(56) References Cited

U.S. PATENT DOCUMENTS

| | | | |
|---|---|---|---|
| 2014/0307502 A1* | 10/2014 | Yang | G11C 11/413 |
| | | | 365/189.11 |
| 2018/0151219 A1* | 5/2018 | Hsu | G11C 7/227 |
| 2022/0130344 A1* | 4/2022 | Li | G11C 11/418 |
| 2022/0189541 A1* | 6/2022 | Yang | G11C 11/418 |

* cited by examiner

SRAM WITH TRACKING CIRCUITRY FOR REDUCING ACTIVE POWER

BACKGROUND

Static random access memory (SRAM) is one type of semiconductor memory and is commonly used in integrated circuits. Embedded SRAM is particularly popular in high speed communication, image processing and system-on-chip (SOC) applications. Typically, SRAM cells include pass-gate transistors coupled with word lines, through which bit data can be read from or written into the SRAM cell. However, pulse widths of the word lines are not optimized and thus large active power is consumed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
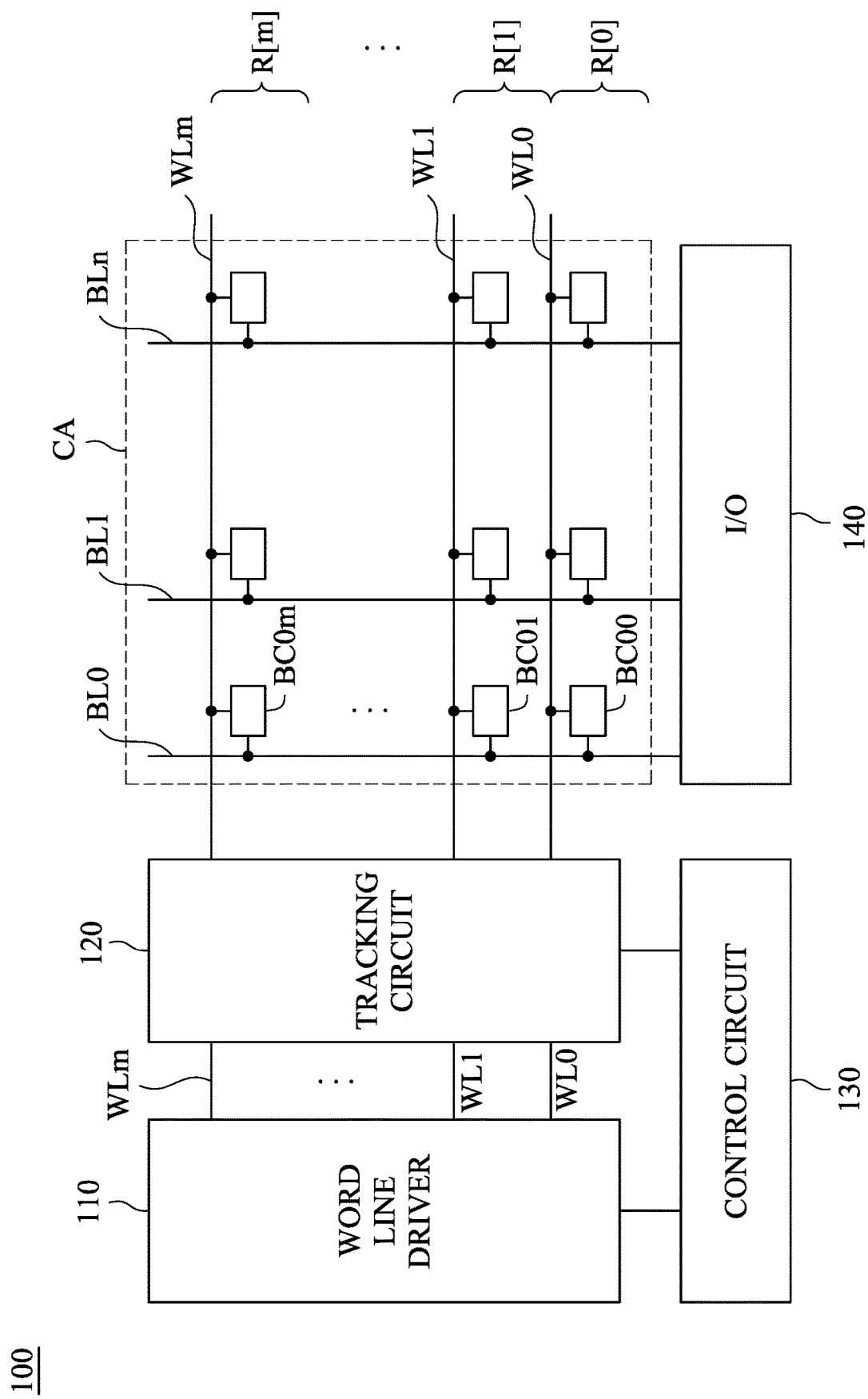
FIG. 1 is a block diagram illustrating a memory device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range.

Numerical quantities given herein are approximate, meaning that the term "around", "about", "approximately" or "substantially" can be inferred if not expressly stated, or meaning other approximate values.

FIG. 1 is a block diagram illustrating a memory device 100, in accordance with some embodiments of the present disclosure. In some embodiments, the memory device 100 is implemented by static random access memory (SRAM). For illustration in FIG. 1, the memory device includes a word line driver 110, a tracking circuit 120, a control circuit 130, an input/output (I/O) circuit 140, and a memory array CA. The word line driver 110 is coupled to the tracking circuit 120 through word lines WL0, WL1, . . . and WLm, and is further coupled to the memory array CA through the word lines WL0, WL1, . . . and WLm. The tracking circuit 120 is coupled to the word line driver 110 and the control circuit 130. The tracking circuit 120 is disposed between the word line driver 110 and the memory array CA. The control circuit 130 is coupled to and disposed next to both of the word line driver 110 and the tracking circuit 120. The I/O circuit 140 is coupled to the memory array CA through bit lines BL0, BL1, . . . and BLn. The I/O circuit 140 is disposed next to the memory array CA.

The memory array CA includes M*N memory cells which includes, for example, the memory cells BC00, BC01, . . . and BC0m. For simplicity, each of the memory cells BC00, BC01, . . . and BC0m is referenced as BC hereinafter for illustration, because the memory cells BC00, BC01, . . . and BC0m operate in a similar way in some embodiments. The memory cells BC are arranged in M rows and N columns. For simplicity of illustration, only few rows R[0], R[1], and R[m], few columns (not labeled) and the corresponding memory cells BC are shown in FIG. 1. The memory cells BC on the same column are coupled to the same bit line BL0, BL1, . . . or BLn and the same complement bit line (not shown). The memory cells BC on the same row R[0], R[1], . . . or R[m] are coupled to the same word line WL0, WL1, . . . or WLm. For simplicity, each of the word lines WL0, WL1, . . . and WLm is referenced as WL hereinafter for illustration, because the word lines WL0, WL1, . . . and WLm operate in a similar way in some embodiments. Similarly, each of the bit lines BL0, BL1, . . . and BLn is referenced as BL hereinafter for illustration, and the rows R[0], R[1], . . . and R[m] is referenced as R[i] hereinafter for illustration. In some embodiments, the label "i" is an integer for illustration.

In some embodiments, bit data are written into the memory cells BC. These bit data are stored in the memory cells BC, and are accessed or read from the memory cells BC. Each of the memory cells BC is configured to write or read one corresponding bit data, based on signals transmitted from the I/O circuit 140 and the word line driver 110. In some embodiments, each of the memory cells BC is implemented by 6 or 8 transistors.

The word line driver 110 is configured to select one of the rows R[i] in the memory array CA, and to provide word line signal (which is shown in at least FIG. 2A) on one of the word lines WL that is arranged on the selected row R[i], in some embodiments. The word line signal is transmitted through the selected word line WL to the corresponding memory cells BC, for writing the bit data into, or reading the bit data from, the corresponding memory cells BC.

The tracking circuit 120 and the control circuit 130 are configured to modulate the word line signal to be transmitted to the memory cells BC, in some embodiments. For example, a shape or a pulse width of the word line signal is modulated by the tracking circuit 120 and the control circuit 130. In some embodiments, the control circuit 130 is implemented by a processor. In some other embodiments, the control circuit 130 is integrated with a processor. The processor is implemented by a central processing unit (CPU), a multi-processor, a distributed processing system, an application specific integrated circuit (ASIC), and/or a suitable processing unit.

The I/O circuit 140 is configured to select one of the columns in the memory array CA, and to provide bit line signal (not shown) on one of the bit line BL that is arranged on the selected column, in some embodiments. The bit line signal is transmitted through the selected bit line BL to the corresponding memory cells BC, for writing the bit data into, or reading the bit data from, the corresponding memory cells BC.

The above numbers of the memory cells BC are given for illustrative purposes, and various numbers of the same are within the contemplated scope of the present disclosure.

The configuration of the memory device 100 as illustrated above is also given for illustrative purposes. Various configurations of the memory device 100 are within the contemplated scope of the present disclosure. For example, in various embodiments, at least two of the word line driver 110, the tracking circuit 120 and the control circuit 130 are integrated together.

In a write or read operation, at least one of the bit lines BL and at least one of the word lines WL are respectively selected by the I/O circuit 140 and the word line driver 110. On one selected column, the selected bit line BL is connected to several word lines WL that are arranged on the various rows R[i]. Alternatively stated, each two of the word lines WL are connected to the selected bit line BL at different locations, for accessing different memory cells BC arranged on the corresponding rows R[i]. When one of the word lines WL on one corresponding row R[i] is selected, the bit line signal is transmitted from the I/O circuit 140 to one corresponding memory cell BC, or the bit line signal is transmitted from the memory cell BC to the I/O circuit 140.

As discussed above, since a path transmitted with the bit line signal is coupled between one of the memory cells BC and the I/O circuit 140, the word lines WL on the different rows R[i] result in multiple paths that have various transmitting lengths. Each of these transmitting lengths is associated with a duration of the corresponding word line WL, for activating the memory cell BC that is arranged in the corresponding column and row R[i], in the reading or writing operation. Alternatively stated, when the selected row R[i] is far from the I/O circuit 140, the transmitting length gets longer, and a pulse width of the corresponding word line signal has to be longer. Similarly, if the transmitting length gets shorter, a pulse width of the corresponding word line signal gets shorter. For example, with reference to FIG. 1, the row R[m] is far from the I/O circuit 140, and the corresponding word line WLm is also far from the control circuit 130 and the I/O circuit 140, with respect to the columns. The row R[0] is near to the I/O circuit 140, and the corresponding word line WL0 is also near to the control circuit 130 and the I/O circuit 140, with respect to the columns.

To adjust the durations of the word lines WL on various rows R[i], the memory device 100 is configured to control back-edges of the corresponding word line signals, according to locations of the corresponding word lines WL on the rows R[i]. In other word, the pulse widths of the word line signals are adjusted by modulating moments of deactivating the word line signals, based on the rows R[i]. Specifically, the above adjustment is made according to lengths substantially distanced from the corresponding rows R[i] to the I/O circuit 140 or to the control circuit 130, with respect to the columns.

Figure 2A:
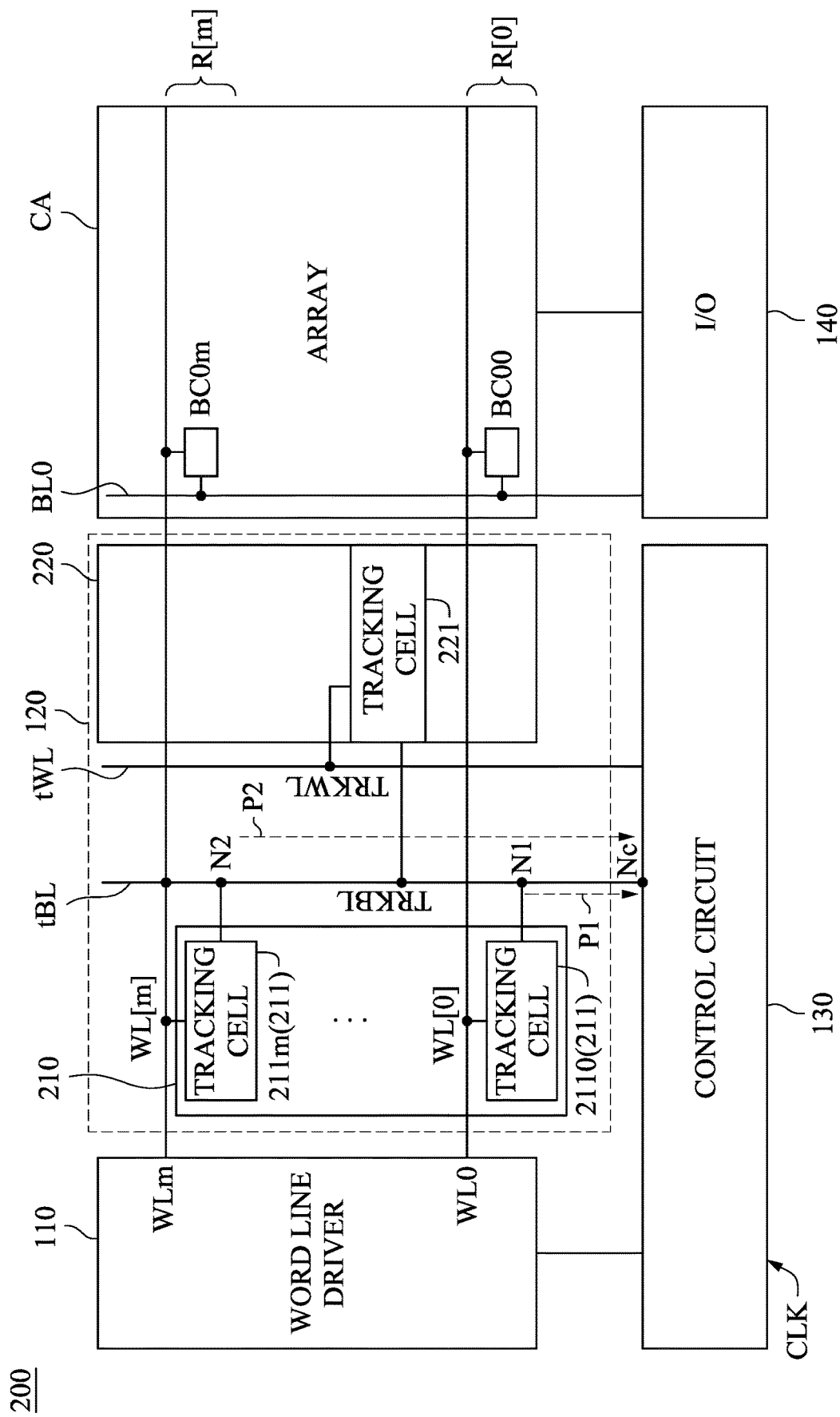
FIG. 2A is a schematic diagram illustrating a memory device corresponding to the memory device shown in FIG. 1, in accordance with some embodiments of the present disclosure.

Reference is now made to FIG. 2A. FIG. 2A is a schematic diagram illustrating a memory device 200 corresponding to the memory device 100 shown in FIG. 1, in accordance with some embodiments of the present disclosure. With respect to the embodiments of FIG. 1, like elements in FIG. 2A are designated with the same reference numbers for ease of understanding. For simplicity of illustration, only few memory cells BC00 and BC0m, and one bit line BL0 are illustrated in the memory array CA in FIG. 2A.

Compared to FIG. 1, in the memory device 200 shown in FIG. 2A, the tracking circuit 120 includes a tracking word line tWL, a tracking bit line tBL, a first tracking unit 210, and a second tracking unit 220. The tracking word line tWL is arranged along the column, and is coupled to the second tracking unit 220 and the control circuit 130. The tracking bit line tBL is also arranged along the column, and is coupled to both of the first tracking unit 210 and the second tracking unit 220. The tracking bit line tBL is further coupled to the control circuit 130 at a node Nc. The first tracking unit 210 is arranged next to the word line driver 110, and is coupled to the word lines WL and the control circuit 130. The second tracking unit 220 is arranged next to the memory array CA, and is coupled to the control circuit 130.

The first tracking unit 210 includes first tracking cells 211 which includes, for example, first tracking cells 2110, . . . , and 211m. For simplicity of illustration, only few first tracking cells 2110 and 211m are shown in FIG. 2A. In some embodiments, each of the first tracking cells 211 is arranged in one corresponding row R[i] and the same column. Each of the first tracking cells 211 is coupled to one corresponding word line WL, and is also coupled to the tracking bit line tBL. For example, as illustrated in FIG. 2A, the first tracking cell 2110 is arranged in the row R[0]. The first tracking cell 2110 is coupled to the word line WL0 and coupled to the tracking bit line tBL at a node N1. The first tracking cell 211m is arranged in the row R[m]. The first tracking cell 211m is coupled to the word line WLm and coupled to the tracking bit line tBL at a node N2.

The second tracking unit 220 includes second tracking cells 221 in which only one of the same is shown in FIG. 2A for simplicity of illustration. In some embodiments, each of the second tracking cells 221 is arranged in one corresponding row R[i] and the same column. In some other embodiments, the second tracking cells 221 are arranged in rows that are different from the rows R[i] in the memory array CA. Alternatively stated, a number of the second tracking cells 221 is different from a number of the memory cells BC arranged on one column. In various embodiments, a number of the second tracking cells 221 and a number of the memory cells BC arranged on one column are the same. As illustrated in FIG. 2A, each of the second tracking cells 221 is coupled to the tracking word line tWL and the tracking bit line tBL.

With reference to FIG. 2A, an exemplary write or read operation to the memory cell BC00 is discussed in the following paragraphs for explanation. In the exemplary write or read operation, when the memory cell BC00 arranged in one column and the row R[0] is selected, the word line driver 110 is configured to charge the word line WL0, for generating a corresponding word line signal WL[0], based on a clock pulse signal CLK. In the meantime, the control circuit 130 is configured to charge the tracking word line tWL, for generating a tracking word line signal TRKWL, based on the clock pulse signal CLK. The tracking word line tWL is configured to transmit the tracking word line signal TRKWL to the second tracking cells 221. Each of the second tracking cells 221 is activated, for emulating writing or reading time consuming by the memory cell BC00. In the meantime, a voltage level of the tracking bit line tBL starts to be pulled to a reference voltage level by the activated second tracking cells 221.

When the word line signal WL[0] is transmitted through the word line WL0 to the memory cell BC00, the first tracking cell 2110 is activated to begin pulling the voltage level of the tracking bit line tBL to the reference voltage level. The voltage level of the tracking bit line tBL is pulled to the reference voltage level by both of the second tracking cells 221 and the first tracking cell 2110, and a tracking bit line signal TRKBL is generated. Alternatively stated, the tracking bit line signal TRKBL having the pulled high or low voltage level is contributed by both of the activated first tracking cell 2110 and the activated second tracking cells 221. Specifically, the tracking bit line signal TRKBL is associated with a duration for emulating the memory cell BC00, which is resulted from the second tracking cells 221. The tracking bit line signal TRKBL is further associated with a duration for controlling a pulse width of the word line signal WL[0], which is resulted from the first tracking cell 2110. Subsequently, the tracking bit line signal TRKBL is transmitted through the tracking bit line tBL to the control circuit 130.

When the control circuit 130 receives the tracking bit line signal TRKBL, the control circuit 130 is configured to control a back-edge of the word line signal WL[0]. In some embodiments, the control circuit 130 is configured to generate a trigger signal (not shown) to the word line driver 110, for triggering a falling edge of the word line signal WL[0]. In some other embodiments, the control circuit 130 is configured to generate a command signal (not shown) to ask the word line driver 110 deactivate the word line signal WL[0]. A back-edge of the word line signal WL[0] is induced accordingly. Continuously, the word line WL0 is discharged by the word line driver 110, and the back-edge of the word line signal WL[0] is generated. When the back-edge of the word line WL0 is transmitted to the memory cell BC00, the memory cell BC00 is deactivated, and the write or read operation ends.

Figure 2C:
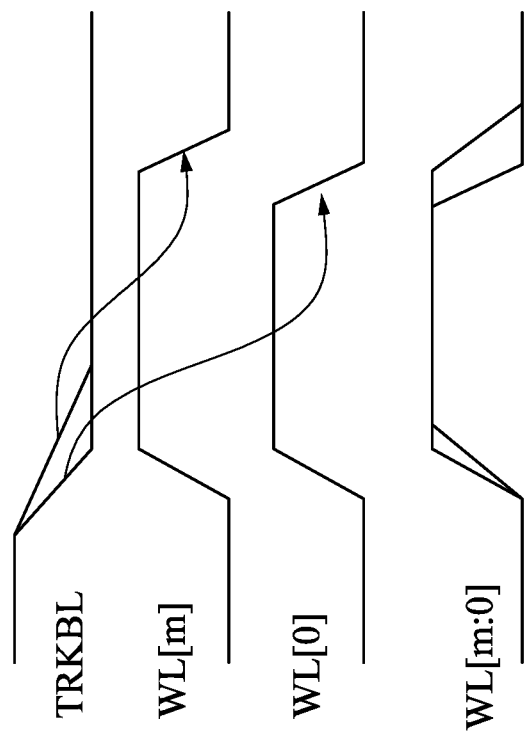
FIGS. 2B-2C are signal waveform diagrams illustrating a relationship between time and voltage level on relative signals in a memory device corresponding to the memory device shown in FIG. 2A, in accordance with some embodiments of the present disclosure.
Figure 2B:
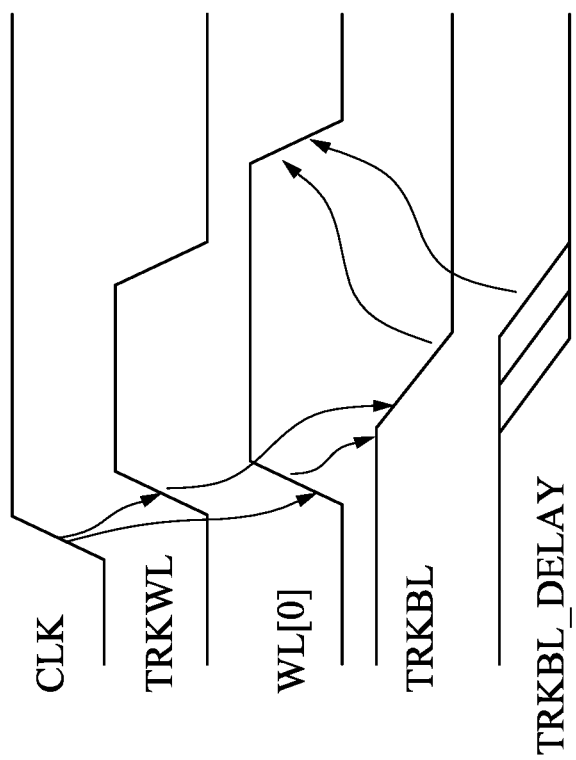

Reference is now made to FIG. 2B. FIG. 2B is a signal waveform diagram illustrating a relationship between time and voltage level on relative signals in a memory device corresponding to the memory device 200 shown in FIG. 2A, in accordance with some embodiments of the present disclosure. For ease of understanding, the embodiments with respect to FIG. 2B are discussed with reference to FIG. 2A, and only illustrates relative signals that are associated with the word line WL0 shown in FIG. 2A as an exemplary embodiment. With respect to the embodiments of FIG. 1 and FIG. 2A, like elements in FIG. 2B are designated with the same reference numbers for ease of understanding.

As illustrated in FIG. 2B, various signals utilized in the memory device 200 shown in FIG. 2A during the write or read operation are illustrated. With reference to FIGS. 2A and 2B, a word line signal WL[0] is provided by the word line driver 110, in response to a rising edge of the clock pulse signal CLK. A tracking word line signal TRKWL is provided by the tracking word line tWL, in response a rising edge of to the clock pulse signal CLK. Due to a resistor-capacitance (RC) loading on the tracking word line tWL is similar to the word line WL0, the tracking word line signal TRKWL has a similar shape of the word line signal WL[0]. Furthermore, front-edges of both of the word line signal WL[0] and the tracking word line signal TRKWL are generated simultaneously, in response to the clock pulse signal CLK. It should be noted that, back-edges of both of the word line signal WL[0] and the tracking word line signal TRKWL are generated at different moments, because the back-edge of the word line signal WL[0] is modulated, based on a tracking bit line signal TRKBL.

The tracking bit line signal TRKBL is provided by the tracking bit line tBL, according to a rising edge of the word line signal WL[0] and/or a rising edge of the tracking word line signal TRKWL. As illustrated in FIG. 2B, in response to a rising edge of the word line signal WL[0], the tracking bit line signal TRKBL starts to fall.

When the tracking bit line signal TRKBL begins falling, as discussed above with reference to FIG. 2A, a voltage level of the tracking bit line signal TRKBL is pulled low to a reference voltage level (not label) by both of the first tracking cell 2110 and the second tracking cells 221. In some embodiments, a voltage level of the tracking bit line signal TRKBL is pulled from logic high to logic low.

With reference to FIGS. 2A-2B, due to the second tracking cells 221 coupled with the tracking bit line tBL, a first delay (not shown) is introduced to the tracking bit line signal TRKBL. The first delay is associated with the duration of the memory cell BC00 stimulations in the write or read operation. Furthermore, due to a RC loading on the tracking bit line tBL along a path P1, a second delay (not shown) is introduced to the tracking bit line signal TRKBL, wherein the path P1 reflects a distance between the memory cell BC00 and the I/O circuit 140. The second delay is controlled by the first tracking cell 2110, in response to a rising edge of the word line signal WL[0]. The second delay is associated with the duration of the word line signal WL[0] that the bit data is effectively written into or is read from the memory cell BC00. In some embodiments, at least one of the first delay or the second delay is indicated as a logic gate delay. In some other embodiments, at least one of the first delay or the second delay is indicated as a wire RC delay.

Specifically, in some embodiments, the RC loading on the tracking bit line tBL along the path P1 is mainly contributed by a resistance of the tracking bit line tBL along the path P1. Since the length of the tracking bit line tBL has a positive correlation with the resistance thereof, when the tracking bit line signal TRKBL is transmitted through the tracking bit line tBL along the path P1, the resistance therebetween gets larger when the length of the path P1 gets longer. Thereby, the second delay introduced to the tracking bit line signal TRKBL gets greater. Alternatively stated, the tracking bit line signal TRKBL is associated with the resistance of the length of the tracking bit line tBL, wherein such length is referred to as a length of the path P1. Specifically, the tracking bit line signal TRKBL is generated based on the resistance of the length of the tracking bit line tBL.

As illustrated in FIG. 2B, in response to a falling edge of the tracking bit line signal TRKBL, a falling edge of the word line signal WL[0] is provided.

Signals TRAKBL_DELAY are provided by the tracking bit line tBL, when various word lines WL on the corresponding rows R[i] are selected. In some embodiments, each of the signals TRAKBL_DELAY is also indicated as one tracking bit line signal TRKBL, depending on which one of the word lines WL is charged and which one of the corresponding cells in the first tracking unit 210 is activated. Resulted from resistances of various lengths of the tracking bit line tBL along the corresponding paths (not shown in FIG. 2A), the second delays on the tracking bit line signal TRKBL cause the starts of falling edges thereof happen at different moments, and it is illustrated as the signals TRAKBL_DELAY in FIG. 2B.

Reference is now made to FIG. 2C. FIG. 2C is a signal waveform diagram illustrating a relationship between time and voltage level on relative signals in a memory device corresponding to the memory device 200 shown in FIG. 2A, in accordance with some embodiments of the present disclosure. For ease of understanding, the embodiments with respect to FIG. 2C are discussed with reference to FIG. 2A, and only illustrates few signals. The embodiments shown in FIG. 2C are alternative embodiments shown in FIG. 2B, in accordance with some embodiments of the present disclosure. With respect to the embodiments of FIG. 1 and FIGS. 2A-2B, like elements in FIG. 2C are designated with the same reference numbers for ease of understanding.

With reference to FIGS. 2A and 2C, an exemplary write or read operation to the memory cell BC0m is discussed in the following paragraphs for explanation. In some embodiments, the memory cell BC0m arranged in one column and the row R[m] is selected. Similar to the operation related to the memory cell BC00 and the word line WL0 discussed above with reference to FIG. 2A, the word line signal WL[m] is provided by the word line driver 110. The tracking word line signal TRKWL (shown in FIG. 2B) is also provided, in some embodiments.

When the word line signal WL[m] is transmitted through the word line WLm to the memory cell BC0m, the first tracking cell 211m starts to pull low the voltage level of the tracking bit line tBL. Alternatively stated, a start of a falling edge of the tracking bit line signal TRKBL is generated, in response to a rising edge of the word line signal WL[m]. A falling edge of the tracking bit line signal TRKBL is therefore provided, contributed by at least one of the first tracking cell 211m or the second tracking cells 221. Continuously, the tracking bit line signal TRKBL is transmitted through the tracking bit line tBL to the control circuit 130.

The control circuit 130 controls a back-edge of the word line signal WL[m] subsequently, and a falling edge of the word line signal WL[m] is generated, in response to a falling edge of the tracking bit line signal TRKBL. The write or read operation for the memory cell BC0m is finished.

As illustrated in FIG. 2C, starts of falling edges of the tracking bit line signals TRKBL are generated at substantially the same time, respectively in response to a rising edge of the word line signal WL[0] and a rising edge of the word line signal WL[m]. Slopes of the falling edges of the tracking bit line signals TRKBL are different, in some embodiments. Alternatively stated, durations, that voltage levels of the tracking bit line signals TRKBL discharged from logic high to logic low, are not the same. Therefore, falling edges of the word lines WL[0] and WL[m] are generated at different moments, in response to the corresponding falling edges of the tracking bit line signals TRKBL.

A superposition of the word line signals WL[0] and WL[m] is indicated as "WL[m:0]" illustrated in FIG. 2C. With reference to FIGS. 2A and 2C, when rising edges of the word line signals WL[0] and WL[m] are generated at substantially the same time, the difference between the falling edges thereof is due to different falling edges of the tracking bit line signals TRKBL. The difference between the falling edges of the tracking bit line signals TRKBL is resulted from resistances of the tracking bit line tBL having various lengths of paths which including, for example, the path P1 and a path P2.

Compared to the path P1 as discussed above with reference FIG. 2A, the path P2 reflects a distance between the memory cell BC0m and the I/O circuit 140. Specifically, the path P1 is distanced from a node N1 to a node Nc. The node N1 is coupled with the first tracking cell 2110 and the tracking bit line tBL, and the node Nc is coupled with the tracking bit line tBL and the control circuit 130. The path P2 is distanced from a node N2 to the node Nc, wherein the node N2 is coupled with the first tracking cell 211m and the tracking bit line tBL. A length of the path P2 is greater than a length of the path P1. Since the length of the path P1 or P2 has a positive correlation with a resistance of the tracking bit line tBL, which further has a positive correlation with a RC delay loading on the tracking bit line tBL, the delay associated with the path P2 is greater than the delay associated with the path P1. Furthermore, as discussed above with reference to FIGS. 2A-2C, falling edges of the word line signals WL[0] and WL[m] are respectively triggered by falling edges of the tracking bit line signals TRKBL with various delay. Accordingly, a falling edge of the word line signal WL[m] is slower than a falling edge of the word line signal WL[0].

In some approaches, tracking cells included in a memory device are configured to simulate memory cells on a selected column, for emulating pulse widths of word line signals that bit data need to be written in these memory cells or to be read from these memory cells. As such, the word line signals for the memory cells on various rows have a same pulse width, and such pulse width is long enough to cover all of the memory cells on the rows especially including the row that is far from a I/O circuit.

Compared to the above approaches, in the embodiments of the present disclosure, for example with reference to FIGS. 2A-2C, extra tracking cells (e.g., the second tracking cells 221) are included in the memory device 200. By arranging these extra tracking cells on various locations relative to the control circuit 130 or the I/O circuit 140, pulse widths of the corresponding word lines are adjusted and optimized, based on the columned lengths substantially distanced from these locations to the control circuit 130 or the I/O circuit 140. Accordingly, the active power is reduced. Furthermore, crow-bar issue for the corresponding word lines WL and bit lines BL is prevented, and a design for the memory device 200 is improved.

Figure 3:
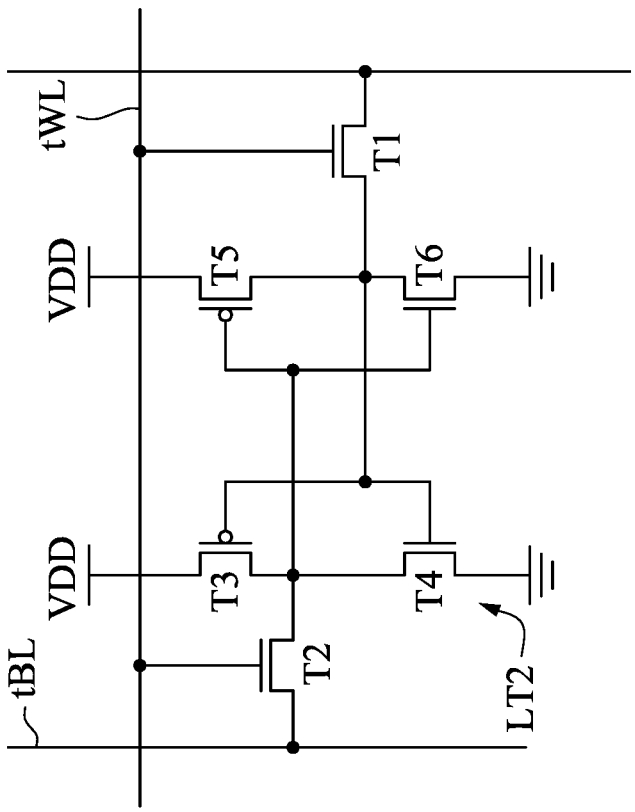
FIG. 3 is an exemplary diagram illustrating structures of one first tracking cell corresponding to one of the first tracking cells shown in FIG. 2A, in accordance with some embodiments of the present disclosure.

Reference is now made to FIG. 3. FIG. 3 is an exemplary diagram illustrating structures of one first tracking cell 300 corresponding to one of the first tracking cells 211 and 212 shown in FIG. 2A, in accordance with some embodiments of the present disclosure. With respect to the embodiments of FIG. 2A, like elements in FIG. 3 are designated with the same reference numbers for ease of understanding.

As illustrated in FIG. 3, the first tracking cell 300 is coupled to a word line WL and a tracking bit line tBL. In some embodiments, the first tracking cell 300 corresponds to one of the first tracking cells 221 included in the first tracking unit 210 shown in FIG. 2A, including, for example, the first tracking cell 2110 or 211m. In some other embodiments, the word line WL corresponds to one of the word lines WL shown in FIG. 2A, including, for example, the word line WL0 or WLm. In various embodiments, the tracking bit line tBL corresponds to the tracking bit line tBL shown in FIG. 2A.

The first tracking cell 300 includes a pair of transistors T1-T2 and a latch circuit LT1 that includes transistors T2-T6. The latch circuit LT1 is coupled between the pair of transistors T1-T2. The latch circuit LT1 is also coupled between a reference node VDD and a reference node VSS which, in some embodiments, is the ground. The pair of transistors T1-T2 are coupled to the word line WL. In some embodiments, the transistors T1, T2, T4 and T6 are n-type metal oxide semiconductor transistors (NMOS transistor). In some embodiments, the transistors T3 and T5 are p-type metal oxide semiconductor transistors (PMOS transistor).

A gate terminal of the transistor T1 is coupled to the word line WL. A source terminal of the transistor T1 is coupled to the latch circuit LT1. A drain terminal of the transistor T1 is coupled to a complementary data line (not label). A gate terminal of the transistor T2 is coupled to the word line WL. A source terminal of the transistor T2 is coupled to the latch circuit LT1. A drain terminal of the transistor T2 is coupled to the tracking bit line tBL.

In some embodiments, when the word line WL is activated to transmit a word line signal (not shown in FIG. 3), the gate terminals of the transistors T1-T2 are configured to receive the word line signal, and the transistors T1-T2 are turned on accordingly. For example, with reference to FIGS. 2A and 3, the transistors T1-T2 are coupled to the word line WL0. The transistors T1-T2 are turned on, in response to the word line signal WL[0].

In some embodiments, when the transistors T1-T2 are turned on, the transistors T1-T2 are configured to activate the latch circuit LT1. Alternatively state, the latch circuit LT1 is turned on by the transistors T1-T2, in response to the word line signal. For example, with reference to FIGS. 2A and 3, the latch circuit LT1 is turned on by activated transistors T1-T2, based on the word line signal WL[0].

Subsequently, in some embodiments, a voltage level of the tracking bit line tBL is influenced by the turned on transistor T2 and the turned on latch circuit LT1. Alternatively state, the turned on latch circuit LT1 is configured to pull down a voltage level of the tracking bit line tBL to a reference node which, in some embodiment, is the ground. For example, with reference to FIGS. 2A-3, the turned on latch circuit LT1 starts to pull low a voltage level of the tracking bit line tBL, in response to a rising edge of the word line signal WL[0].

Figure 4:
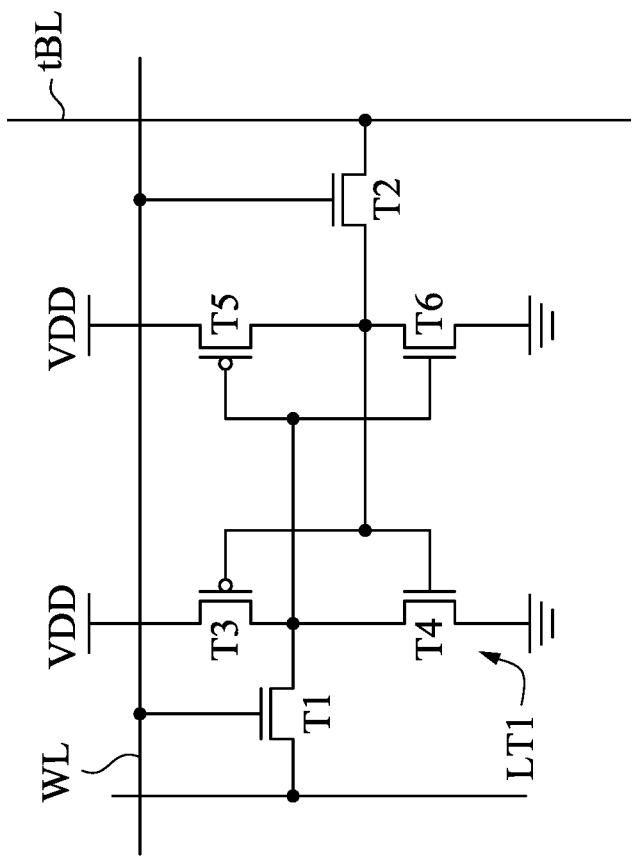
FIG. 4 is an exemplary diagram illustrating structures of one second tracking cell corresponding to one of the second tracking cells shown in FIG. 2A, in accordance with some embodiments of the present disclosure.

Reference is now made to FIG. 4. FIG. 4 is an exemplary diagram illustrating structures of one second tracking cell 400 corresponding to one of the second tracking cells 221 shown in FIG. 2A, in accordance with some embodiments of the present disclosure. With respect to the embodiments of FIG. 2A, like elements in FIG. 4 are designated with the same reference numbers for ease of understanding.

As illustrated in FIG. 4, the second tracking cell 400 is coupled to a tracking word line TRKWL and a tracking bit line tBL. In some embodiments, the second tracking cell 400 corresponds to one of the second tracking cells 211 included in the second tracking unit 220 shown in FIG. 2A. In some other embodiments, the tracking word line TRKWL corresponds the tracking word line TRKWL shown in FIG. 2A. In various embodiments, the tracking bit line tBL corresponds to the tracking bit line tBL shown in FIG. 2A.

The second tracking cell 400 includes a pair of transistors T1-T2 and a latch circuit LT2 that includes transistors T2-T6. Compared to the first tracking cell 300 shown in FIG. 3, gate terminals of the transistor T1-T2 are coupled to the tracking word line TRKWL. The second tracking cell 400 has similar configurations of the first tracking cell 300 shown in FIG. 3, which is not detailed herein.

In some embodiments, the gate terminals of the transistors T1-T2 are configured to receive a tracking word line signal (not shown in FIG. 4) that is transmitted through the tracking word line tWL, and the transistors T1-T2 are turned on accordingly. For example, with reference to FIGS. 2A and 4, the transistors T1-T2 are turned on, in response to the tracking word line signal TRKWL.

In some embodiments, the latch circuit LT2 is turned on by the transistors T1-T2, in response to the tracking word line signal. Subsequently, the turned on latch circuit LT2 is configured to begin pulling down a voltage level of the tracking bit line tBL to a reference node which, in some embodiment, is the ground. For example, with reference to FIGS. 2A-2C and 4, in response to a rising edge of the tracking word line signal TRKWL, the latch circuit LT2 is turned on, for starting to pull low a voltage level of the tracking bit line tBL.

Figure 5:
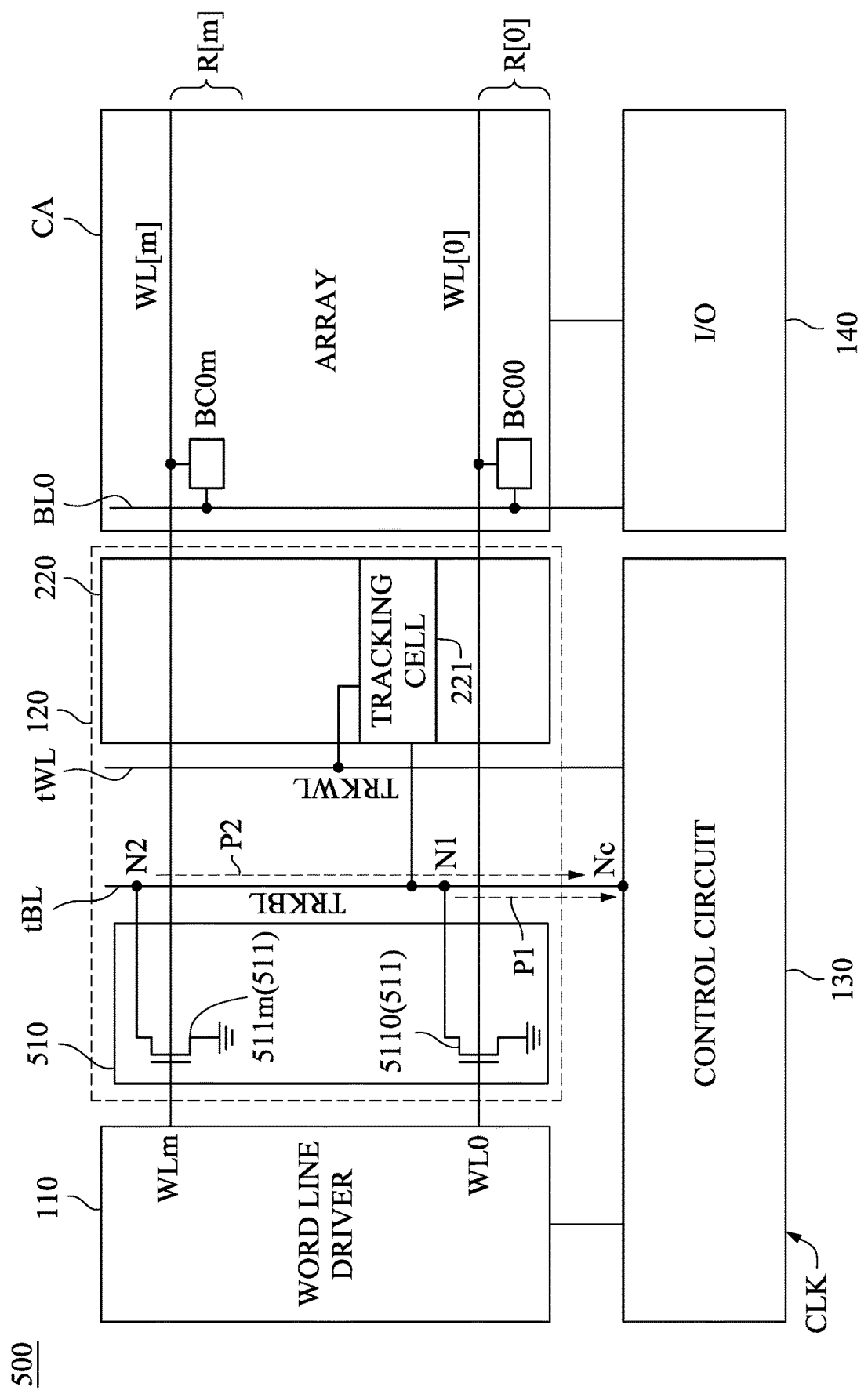
FIG. 5 is a schematic diagram illustrating a memory device corresponding to the memory device shown in FIG. 1, in accordance with some embodiments of the present disclosure.

Reference is now made to FIG. 5. FIG. 5 is a schematic diagram illustrating a memory device 500 corresponding to the memory device 100 shown in FIG. 1, in accordance with some embodiments of the present disclosure. The embodiments shown in FIG. 5 are alternative embodiments shown in FIG. 2A, in accordance with some embodiments of the present disclosure. The memory cell 500 has similar configurations of the memory device 200 shown in FIG. 2A, which is not detailed herein. With respect to the embodiments of FIG. 1 and FIG. 2A, like elements in FIG. 5 are designated with the same reference numbers for ease of understanding.

Compared to FIG. 2A, in the memory device 500 shown in FIG. 5, the first tracking unit 510 includes pull-down transistors 511 which includes, for example, pull-down transistors 5110, . . . and 511m. In some embodiments, the first tracking unit 510 corresponds to the first tracking unit 210 shown in FIG. 2A. In some other embodiments, the pull-down transistors 511 correspond to the first tracking cells 211 shown in FIG. 2A. In some embodiments, each of the pull-down transistors 511 is implemented by a NMOS transistor. As illustrated in FIG. 5A, gate terminals of the pull-down transistors 511 are coupled to the corresponding word lines WL. Drain terminals of the pull-down transistors 511 are coupled to the tracking bit line tBL at the corresponding nodes including, for example, nodes N1 and N2. Source terminals of the pull-down transistors 511 are coupled to the corresponding reference nodes which, in some embodiments, are the grounds. Specifically, the gate terminal of the pull-down transistor 5110 is coupled to the word line WL0, and the drain terminal of the pull-down transistor 5110 is coupled to the tracking bit line tBL at the node N1. The gate terminal of the pull-down transistor 511m is coupled to the word line WLm, and the drain terminal of the pull-down transistor 511m is coupled to the tracking bit line tBL at the node N2.

A signal waveform diagram illustrating a relationship between time and voltage level on relative signals in a memory device corresponding to the memory device 500 shown in FIG. 5 is illustrated in FIGS. 2B-2C. These relative signals are discussed above with reference to FIG. 2A-2C, which is not detailed herein.

Figure 6A:
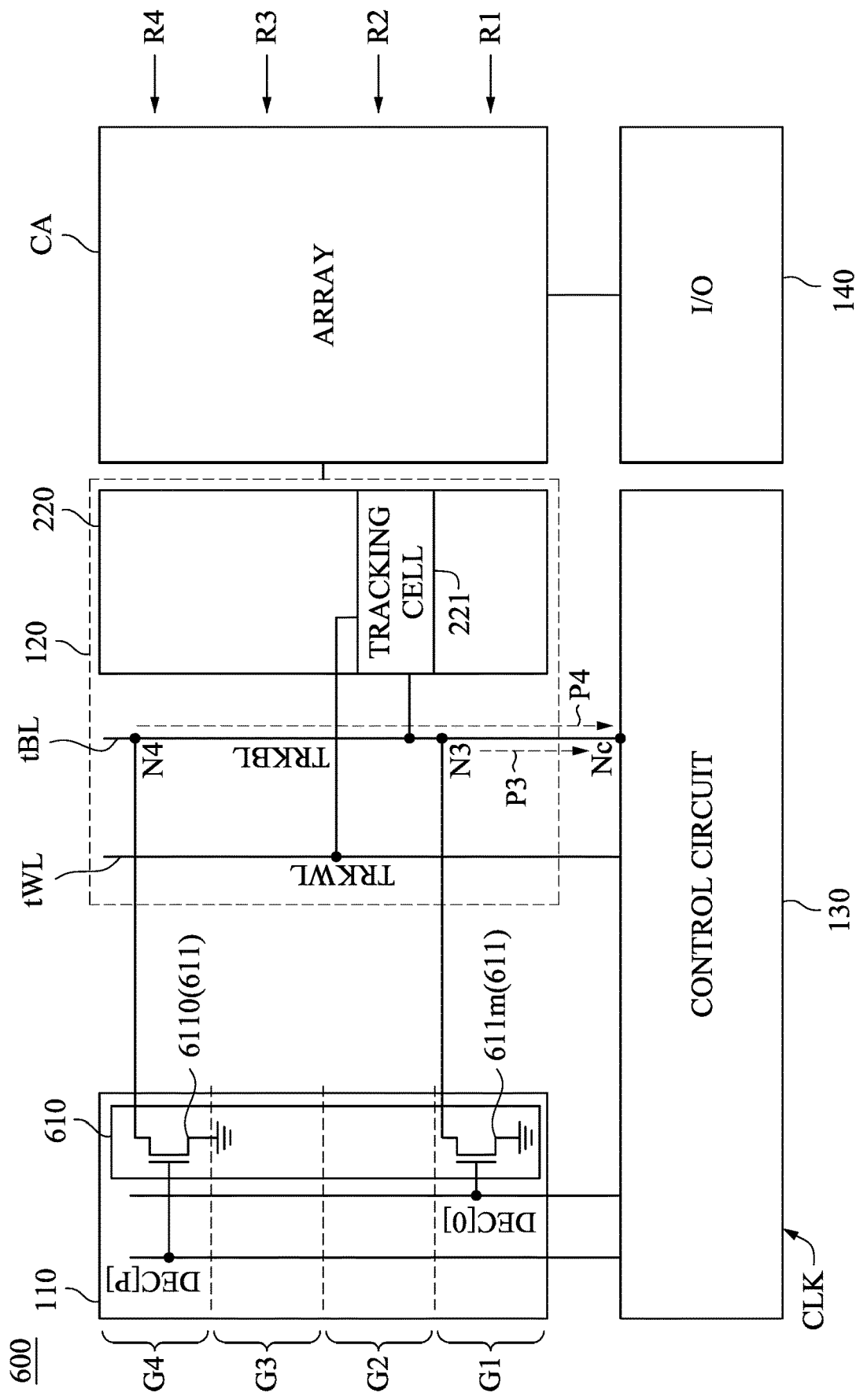
FIG. 6A is a schematic diagram illustrating a memory device corresponding to the memory device shown in FIG. 1, in accordance with some embodiments of the present disclosure.

Reference is now made to FIG. 6A. FIG. 6A is a schematic diagram illustrating a memory device 600 corresponding to the memory device 100 shown in FIG. 1, in accordance with some embodiments of the present disclosure. The embodiments shown in FIG. 6A are alternative embodiments shown in FIG. 2A, in accordance with some embodiments of the present disclosure. The memory cell 600 has similar configurations of the memory device 200 shown in FIG. 2A, which is not detailed herein. With respect to the embodiments of FIG. 1 and FIG. 2A, like elements in FIG. 6A are designated with the same reference numbers for ease of understanding.

Compared to FIG. 2A, in the memory device 600 shown in FIG. 6A, the word line driver 110 includes decoded address lines DL0, . . . and DLP that are coupled between the control circuit 130 and the word lines WL (which are shown in FIG. 2A). For simplicity, each of the decoded address lines DL0, . . . and DLP is referenced as DL hereinafter for illustration, because the decoded address lines DL0, . . . and DLP operate in a similar way in some embodiments. In addition, a first tracking unit 610 is included in the word line driver 110. In some embodiments, the first tracking unit 610 is integrated with the tracking circuit 120. As illustrated in FIG. 6A, the first tracking unit 610 includes pull-down transistors 611 which includes, for example, pull-down transistors 6110, . . . , 611m, that are coupled between the decoded address lines DL and the tracking bit line tBL. In some embodiments, each of the pull-down transistors 611 is implemented by a NMOS transistor. For simplicity of illustration, only few decoded address lines DL0 and DLP, and few pull-down transistors 611 are shown in FIG. 6A.

In some embodiments, the word line driver 110 further includes a word line decoder (not shown). The word line decoder is coupled to the decoded address lines DL, and is configured to generate decoded address line signals DEC[0], . . . and/or DEC[P]. In some other embodiments, the decoded address line signals DEC[0], . . . and DEC[P] are respectively transmitted through the decoded address lines DL0, . . . and DLP, for selecting the corresponding word lines WL.

As illustrated in FIG. 6A, the decoded address lines DL are separated into several groups G1, G2, G3 and G4. The groups G1-G4 are arranged in grouped rows R1, R2, R3 and R4. Each one of the grouped rows R1-R4 includes a number of rows that correspond to the rows R[0], . . . and R[m] shown in FIG. 2A. The decoded address lines DL belongs to various the groups G1-G4. Each one of the decoded address lines DL is disposed in one corresponding grouped rows R1-R4, and is coupled to one of the pull-down transistors 611. In some embodiments, each one of the decoded address lines DL is further coupled to a number of the word lines WL (not shown in FIG. 6A). For example, with reference to FIG. 6A, the decoded address line DL0 of the group G1 is arranged in the grouped row R1. The decoded address line DL0 is coupled to the pull-down transistor 6110 and coupled to the word lines WL0, WL1, . . . , WLi that are also arranged in the grouped row R1. The decoded address line DLP of the group G4 is arranged in the grouped row R4. The decoded address line DLP is coupled to the pull-down transistor 611m and coupled to the word lines WL3i+1, WL3i+2, WLm that are also arranged in the grouped row R4. In some embodiments, the label "i" is an integer for illustration.

Number and arrangements of the decoded address lines DL and the groups G1-G4 are given for illustration, various numbers and arrangements of the decoded address lines DL and the groups G1-G4 to implement the word line driver 110 are within the contemplated scope of the present disclosure.

Gate terminals of the pull-down transistors 611 are coupled to the decoded address lines DL, respectively. Drain terminals of the pull-down transistors 611 are coupled to the tracking bit line tBL at various locations. Source terminals of the pull-down transistors 611 are respectively coupled to reference nodes which, in some embodiments, are the grounds. For example, as illustrated in FIG. 6A, a gate terminal of the pull-down transistor 6110 is coupled to the decoded address line DL0. A drain terminal of the pull-down transistor 6110 is coupled to the tracking bit line tBL at a node N3. A source terminal of the pull-down transistor 6110 is coupled to the ground. A gate terminal of the pull-down transistor 611m is coupled to the decoded address line DLP. A drain terminal of the pull-down transistor 611m is coupled to the tracking bit line tBL at a node N4. A source terminal of the pull-down transistor 611m is coupled to the ground.

With reference to FIGS. 2A and 6A, an exemplary write or read operation to the memory cells BC is discussed in the following paragraphs for explanation. The write or read operation performed by the memory device 600 are similar to that performed by the memory device 200 shown in FIG. 2A, which is not detailed herein. In the exemplary write or read operation, in some embodiments, the memory cell BC00 arranged on the row R[0] is selected, wherein the row R[0] shown in 2A is included in the grouped row R1 shown in FIG. 6A. To select the word line WL0 arranged in the group G1, the word line driver 110 is configured to charge the decoded address line DL0, for generating a decoded address line signal DEC[0], based on the clock pulse signal CLK.

When the decoded address line signal DEC[0] is generated, the decoded address line signal DEC[0] is transmitted through the decoded address line DL0 to the gate terminal of the pull-down transistor 6110. The pull-down transistor 6110 is activated, in response to the decoded address line signal DEC[0].

Subsequently, the voltage level of the tracking bit line tBL starts to be pulled down to the reference voltage level by both of the second tracking cells 221, which is discussed above with reference to FIG. 2A, and the activated pull-down transistor 6110. Specifically, the turned on pull-down transistor 6110 begins pulling down the voltage level of the tracking bit line tBL to the ground, in response to the decoded address line signal DEC[0].

When the decoded address line signal DEC[0] is generated, in some embodiments, the word line WL0 is therefore charged by the word line driver 110, as the selected one of the word lines WL. Continuously, the control circuit 130 is configured to control a back-edge of the word line signal WL[0], by receiving the tracking bit line signal TRKBL transmitted through the tracking bit line tBL.

In another exemplary write or read operation that is discussed in the following paragraphs for explanation, with reference to FIGS. 2A and 6A, the memory cell BC0m arranged on the row R[m] is selected. The row R[m] shown in FIG. 2A is included in the grouped row R4 shown in FIG. 6A. To select the word line WLm arranged in the group G4, the word line driver 110 is configured to charge the decoded address line DLP, for generating a decoded address line signal DEC[P], based on the clock pulse signal CLK.

Similar to the above operation related to the memory cell BC00 in the grouped row R1, when the decoded address line signal DEC[P] is generated, the decoded address line signal DEC[P] is transmitted through the decoded address line DLP to the gate terminal of the pull-down transistor 611m. The pull-down transistor 611m is activated, in response to the decoded address line signal DEC[P].

Subsequently, the voltage level of the tracking bit line tBL starts to be pulled down to the reference voltage level by both of the second tracking cells 221, which is discussed above with reference to FIG. 2A, and the activated pull-down transistor 611m. Specifically, the turned on pull-down transistor 611m begins pulling down the voltage level of the tracking bit line tBL to the ground, in response to the decoded address line signal DEC[P].

When the decoded address line signal DEC[P] is generated, in some embodiments, the word line WLm is therefore charged by the word line driver 110, as the selected one of the word lines WL. Continuously, the control circuit 130 is configured to control a back-edge of the word line signal WL[m], by receiving the tracking bit line signal TRKBL transmitted through the tracking bit line tBL.

Figure 6B:
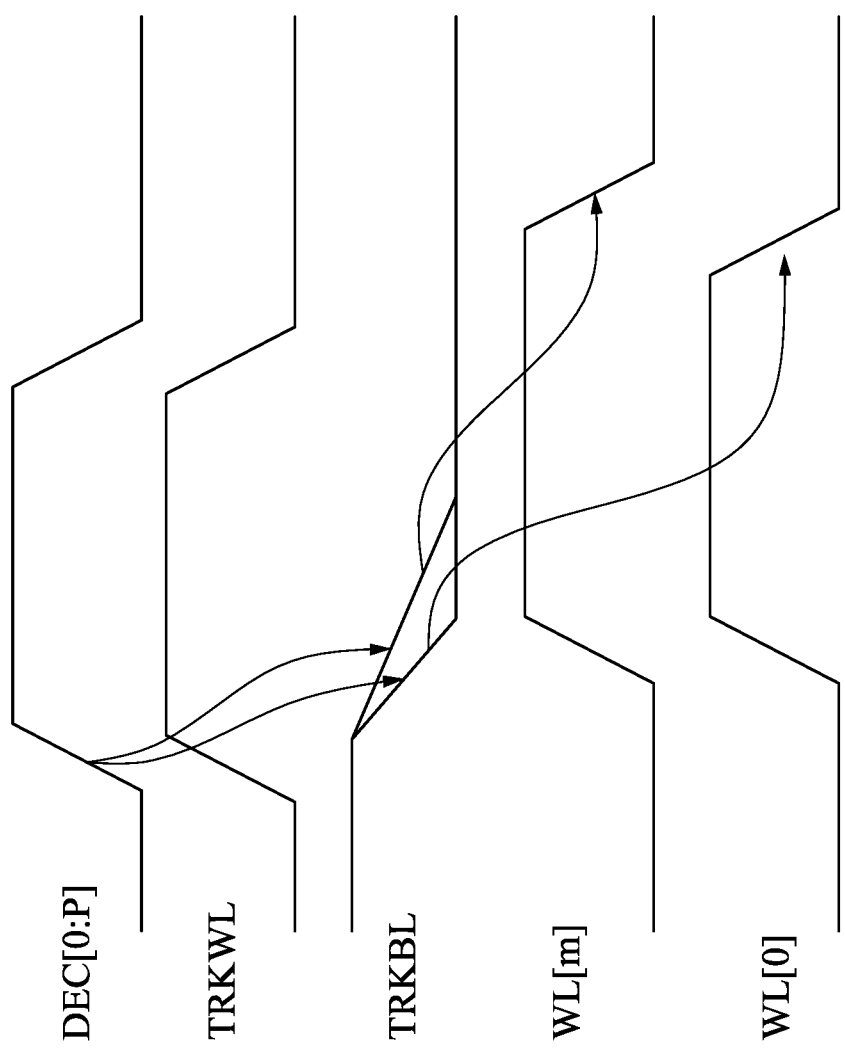
FIG. 6B is a signal waveform diagram illustrating a relationship between time and voltage level on relative signals in a memory device corresponding to the memory device shown in FIG. 6A, in accordance with some embodiments of the present disclosure.

Reference is now made to FIG. 6B. FIG. 6B is a signal waveform diagram illustrating a relationship between time and voltage level on relative signals in a memory device corresponding to the memory device 600 shown in FIG. 6A, in accordance with some embodiments of the present disclosure. For ease of understanding, the embodiments with respect to FIG. 6B are discussed with reference to FIG. 6A, and only illustrates relative signals that are associated with the decoded address line signals DEC[0] and DEC[P] shown in FIG. 6A as an exemplary embodiment. With respect to the embodiments of FIGS. 2A-2C and FIG. 6A, like elements in FIG. 6B are designated with the same reference numbers for ease of understanding.

With reference to FIGS. 6A and 6B, in the exemplary write or read operation, in some embodiments, the memory cells BC00 and BC0m (which are shown in FIG. 2A) respectively arranged on the grouped rows R1 and R4 are selected. The decoded address line signals DEC[0] and DEC[P] are provided by the word line driver 110. The decoded address line signals DEC[0] and DEC[P] have the same shape and pulse width. As such, a superposition of the decoded address line signals DEC[0] and DEC[P] is indicated as "DEC[0:P]" illustrated in FIG. 6B.

When the decoded address line signals DEC[0] and DEC[P] are respectively transmitted through the decoded address lines DL0 and DLP to select the corresponding word lines WL0 and WLm, each one of the pull-down transistors 6110 and 611m is configured to start to pull low the voltage level of the tracking bit line tBL. Alternatively stated, the tracking bit line signals TRKBL start to fall, by the pull-down transistors 6110 and 611m that are activated when they receive the decoded address line signals DEC[0] and DEC[P]. In another way to explain, starts of falling edges of the tracking bit line signals TRKBL are generated, in response to rising edges of the decoded address line signals DEC[0] and DEC[P] respectively.

Specifically, with reference to FIGS. 6A and 6B, one of the tracking bit line signals TRKBL starts to fall, in response to a rising edge of the decoded address line signal DEC[0]. In operations, the tracking bit line signal TRKBL is transmitted through the tracking bit line tBL within a length of a path P3. Due to a resistance of the tracking bit line tBL having a length of a path P3, a third delay (not labeled) is introduced to such one of the tracking bit line signal TRKBL that the voltage level is changed from logic high to logic low. The length of the path P3 is distanced from a node N3 to a node Nc.

Similarly, with reference to FIGS. 6A and 6B, another one of the tracking bit line signal TRKBL starts to fall, in response to a rising edge of the decoded address line signal DEC[P]. In operations, the tracking bit line signal TRKBL is transmitted through the tracking bit line tBL within a length of a path P4, which is distanced from the node N4 to the node Nc. Due to a resistance of the tracking bit line tBL having a length of the path P4, a fourth delay (not labeled) is introduced to the tracking bit line signal TRKBL that the voltage level is changed from logic high to logic low.

As illustrated in FIG. 6B, a falling edge of the word line signal WL[0] is generated, in response to a falling edge of the tracking bit line signal TRKBL that is associated with the third delay. Also, a falling edge of the word line signal WL[m] is also generated, in response to a falling edge of the tracking bit line signal TRKBL that is associated with the fourth delay.

The tracking word line signal TRKWL is also provided, as discussed above with reference to FIGS. 2A-2B.

With reference to FIGS. 6A and 6B, Back-edges of the word line signals WL[0] and WL[m] are provided and controlled by the control circuit 130, in response to the falling edges of the tracking bit line signals TRKBL respectively. It also indicates that the corresponding write or read operations are finished.

As illustrated in FIG. 6B, the difference between slews of the tracking bit line signals TRKBL is resulted from resistances of different lengths of the tracking bit line tBL, which is also referred to as RC delays loading on thereof. The lengths of the tracking bit line tBL include a third length of the path P3 and a fourth length of the path P4. The path P3 reflects a distance between the grouped row R1 and the I/O circuit 140, and also indicates a location where the decoded address line DEC[0] of the group G1 is disposed. Specifically, the path P3 is distanced from the node N3 to the node Nc. The node N3 is coupled with the pull-down transistor 6110 and the tracking bit line tBL.

Compared to the path P3, the path P4 reflects a distance between the grouped row R4 and the I/O circuit 140, and also indicates a location where the decoded address line DEC[P] of the group G4 is disposed. Specifically, the path P4 is distanced from the node N4 to the node Nc. The node N4 is coupled with the pull-down transistor 611m and the tracking bit line tBL. A length of the path P3 is smaller than a length of the path P4. Since the length of the path P3 or P4 has a positive correlation with a resistance of the tracking bit line tBL, which further has a positive correlation with a RC delay loading on the tracking bit line tBL, the delay associated with the path P3 is smaller than the delay associated with the path P4. Accordingly, a falling edge of the word line signal WL[0] is faster than a falling edge of the word line signal WL[m].

Figure 7A:
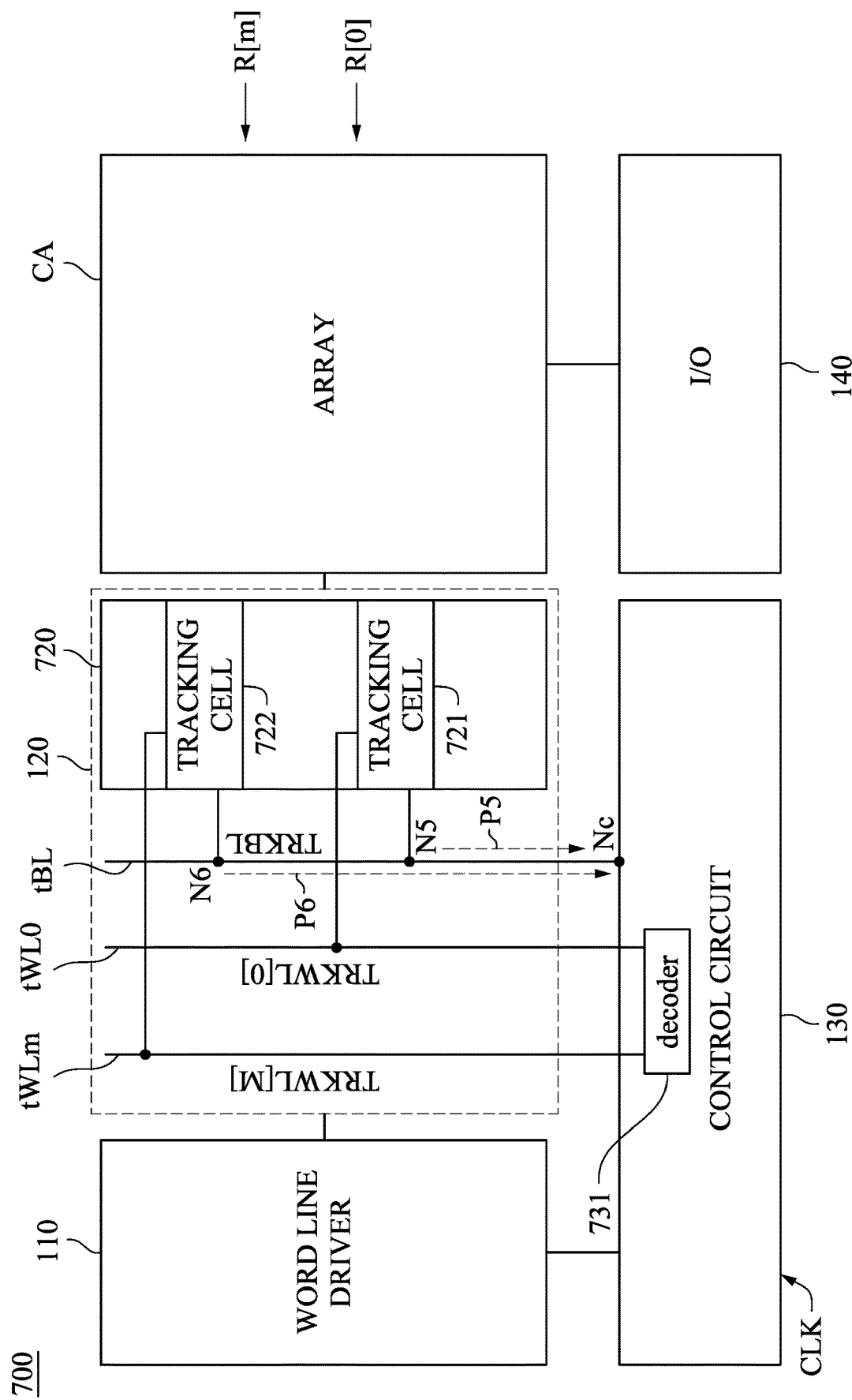
FIG. 7A is a schematic diagram illustrating a memory device corresponding to the memory device shown in FIG. 1, in accordance with some embodiments of the present disclosure.

Reference is now made to FIG. 7A. FIG. 7A is a schematic diagram illustrating a memory device 700 corresponding to the memory device 100 shown in FIG. 1, in accordance with some embodiments of the present disclosure. The embodiments shown in FIG. 7A are alternative embodiments shown in FIG. 2A and FIG. 6A, in accordance with some embodiments of the present disclosure. The memory cell 700 has similar configurations of the memory device 200 shown in FIG. 2A and similar configurations of the memory device 600 shown in FIG. 6A, which is not detailed herein. With respect to the embodiments of FIGS. 1, 2A and 6A, like elements in FIG. 7A are designated with the same reference numbers for ease of understanding.

Compared to FIG. 2A, in the memory device 700 shown in FIG. 7A, the tracking circuit 120 includes tracking word lines tWL0, . . . and tWLm. The tracking word lines tWL0, . . . and tWLm are arranged in columns, and are arranged next to the tracking bit line tBL. Furthermore, the control circuit 130 includes a decoder 731. The second tracking unit 720 is arranged between the tracking word lines tWL0, . . . and tWLm and the memory array CA. The second tracking unit 720 includes second tracking cells 721 and 722, etc. that are arranged in rows. The decoder 731 is coupled to the tracking word lines tWL0, . . . and tWLm. The tracking word lines tWL0, . . . and tWLm are coupled to the second tracking cells 721 and 722 and the like respectively. Specifically, as illustrated in FIG. 7A, the tracking word line tWL0 is coupled to the decoder 731 and coupled to the second tracking cell 721 at a node N5. The tracking word line tWLm is coupled to the decoder 731 and coupled to the second tracking cell 722 at a node N6.

Number and arrangements of the tracking word lines tWL0, . . . and tWLm and the second tracking cells 721 and 722, etc. are given for illustration, various numbers and arrangements of the tracking word lines tWL0, . . . and tWLm and the second tracking cells 721 and 722, etc. to implement the tracking circuit 120 are within the contemplated scope of the present disclosure. In some embodiments, at least one of the tracking word lines tWL0, . . . and tWLm corresponds to the tracking word line tWL shown in FIG. 2A. In some other embodiments, at least one of the second tracking cells 721 and 722, etc. corresponds to one of the second tracking cell 221 shown in FIG. 2A. in various embodiments, at least one of the second tracking cells 721 and 722, etc. corresponds to one of the second tracking cell 400 shown in FIG. 4.

The decoder 731 is configured to select one of the tracking word lines tWL0, . . . and tWLm, in some embodiments, for transmitting one of corresponding tracking word line signals TRKWL[0], . . . , and TRKWL[m] through the selected tracking word lines tWL0, . . . and tWLm. For example, with reference to FIGS. 2A and 7A, when the memory cell BC00 on the row R[0] is selected to perform the write or read operation, the tracking word line tWL0 is charged by the decoder 731, in response to the clock pulse signal CLK. Subsequently, the tracking word line signal TRKWL[0] is transmitted through the tracking word line tWL0 to the second tracking cell 721. Similarly, when the memory cell BC0m on the row R[m] is selected, the decoder 731 is configured to select the tracking word line tWLm, in response to the clock pulse signal CLK. The tracking word line signal TRKWL[m] is transmitted through the tracking word line tWLm to the second tracking cell 722.

With reference to FIGS. 2A and 7A, when the second tracking cell 721 is activated by receiving the tracking word line signal TRKWL[0], the second tracking cell 721 starts to pull low the voltage level of the tracking bit line tBL at the node N5. Similarly, when the second tracking cell 722 is turned on by receiving the tracking word line signal TRKWL[m], the second tracking cell 721 starts to pull low the voltage level of the tracking bit line tBL at the node N6.

Continuously, the tracking bit line signal TRKBLs are transmitted through the tracking bit line tBL to the control circuit 130, respectively. A back-edge of the word line signal WL[0] is therefore controlled by the control circuit 130, based on the received tracking bit line signal TRKBL that is associated with the tracking word line signal TRKWL[0] and the second tracking cell 721. Similarly, A back-edge of the word line signal WL[m] is therefore controlled by the control circuit 130, based on the received tracking bit line signal TRKBL that is associated with the tracking word line signal TRKWL[m] and the second tracking cell 722.

Figure 7B:
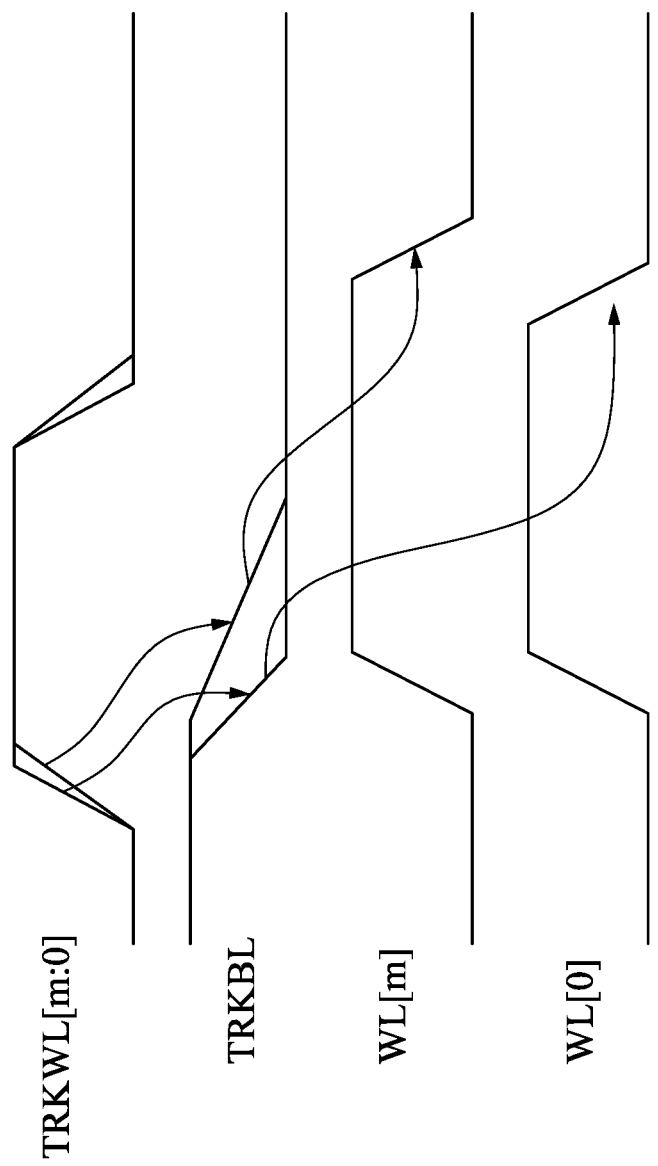
FIG. 7B is a signal waveform diagram illustrating a relationship between time and voltage level on relative signals in a memory device corresponding to the memory device shown in FIG. 7A, in accordance with some embodiments of the present disclosure.

Reference is now made to FIG. 7B. FIG. 7B is a signal waveform diagram illustrating a relationship between time and voltage level on relative signals in a memory device corresponding to the memory device 700 shown in FIG. 7A, in accordance with some embodiments of the present disclosure. For ease of understanding, the embodiments with respect to FIG. 7B are discussed with reference to FIG. 7A, and only illustrates relative signals that are associated with the tracking word line signals TRKWL[0] and TRKWL[m] shown in FIG. 7A as an exemplary embodiment. With respect to the embodiments of FIGS. 2A-2C and FIG. 7A, like elements in FIG. 7B are designated with the same reference numbers for ease of understanding.

With reference to FIGS. 7A and 7B, in the exemplary write or read operation, in some embodiments, that the memory cells BC00 and BC0m (which are shown in FIG.

2A) respectively arranged on the rows R[0] and R[m] are selected. The tracking word line signals TRKWL[0] and TRKWL[m] are provided by the decoder 731.

When the tracking word line signals TRKWL[0] and TRKWL[m] are respectively transmitted through the tracking word lines tWL0 and tWLm, each of the second tracking cells 711 and 712 begins pulling low the voltage level of the tracking bit line tBL. Alternatively stated, the tracking bit line signals TRKBL start to fall, in response to rising edges of the tracking word line signals TRKWL[0] and TRKWL[m] respectively. Therefore, back-edges of the word line signals WL[0] and WL[m] are controlled by the control circuit 130, in response to the falling edges of the tracking bit line signals TRKBL respectively, and the corresponding write or read operations are finished.

Specifically, with reference to FIGS. 7A and 7B, a start of a falling edge of the tracking bit line signal TRKBL is generated, in response to a rising edge of the tracking word line signal TRKWL[0]. Due to a resistance of a fifth length of the tracking bit line tBL, a fifth delay (not labeled) is introduced to the tracking bit line signal TRKBL that the voltage level is changed from logic high to logic low. The fifth length is referred to as a length of a path P5, which is distanced from a node N5 to a node Nc. A falling edge of the word line signal WL[0] is therefore generated, in response to a falling edge of the tracking bit line signal TRKBL that is associated with the fifth delay.

Similarly, the tracking bit line signal TRKBL starts to fall, in response to a rising edge of the tracking word line signal TRKWL[m]. Due to a resistance of a sixth length of the tracking bit line tBL, a sixth delay (not labeled) is introduced to the tracking bit line signal TRKBL that the voltage level is changed from logic high to logic low. The sixth length is referred to as a length of a path P6, which is distanced from a node N6 to a node Nc. A falling edge of the word line signal WL[m] is therefore generated, in response to a falling edge of the tracking bit line signal TRKBL that is associated with the sixth delay. In some embodiments, the tracking bit line signal TRKBL is transmitted through the tracking bit line tBL within a length of the path P6, which is distanced from the node N6 to the node Nc.

As illustrated in FIG. 7B, the difference between slews of the tracking bit line signals TRKBL is resulted from resistances of the tracking bit line tBL having the fifth length of the path P5 and the sixth length of the path P6, which is also referred to as RC delays loading on the tracking bit line tBL along the path P5 and the path P6. The path P5 indicates a location where the memory cell (e.g., the memory cell BC00) to be written or read is disposed, and the path P6 indicates a location where the memory cell (e.g., the memory cell BC0m) to be written or read is disposed. A length of the path P5 is different from a length of the path P6. Since the length of the path P5 or P6 has a positive correlation with a resistance of the tracking bit line tBL, which further has a positive correlation with a RC delay loading on the tracking bit line tBL, the delay associated with the path P5 is different from the delay associated with the path P6. Accordingly, timing of falling edges of the word line signals WL[0] and WL[m] are different to each other.

Figure 8:
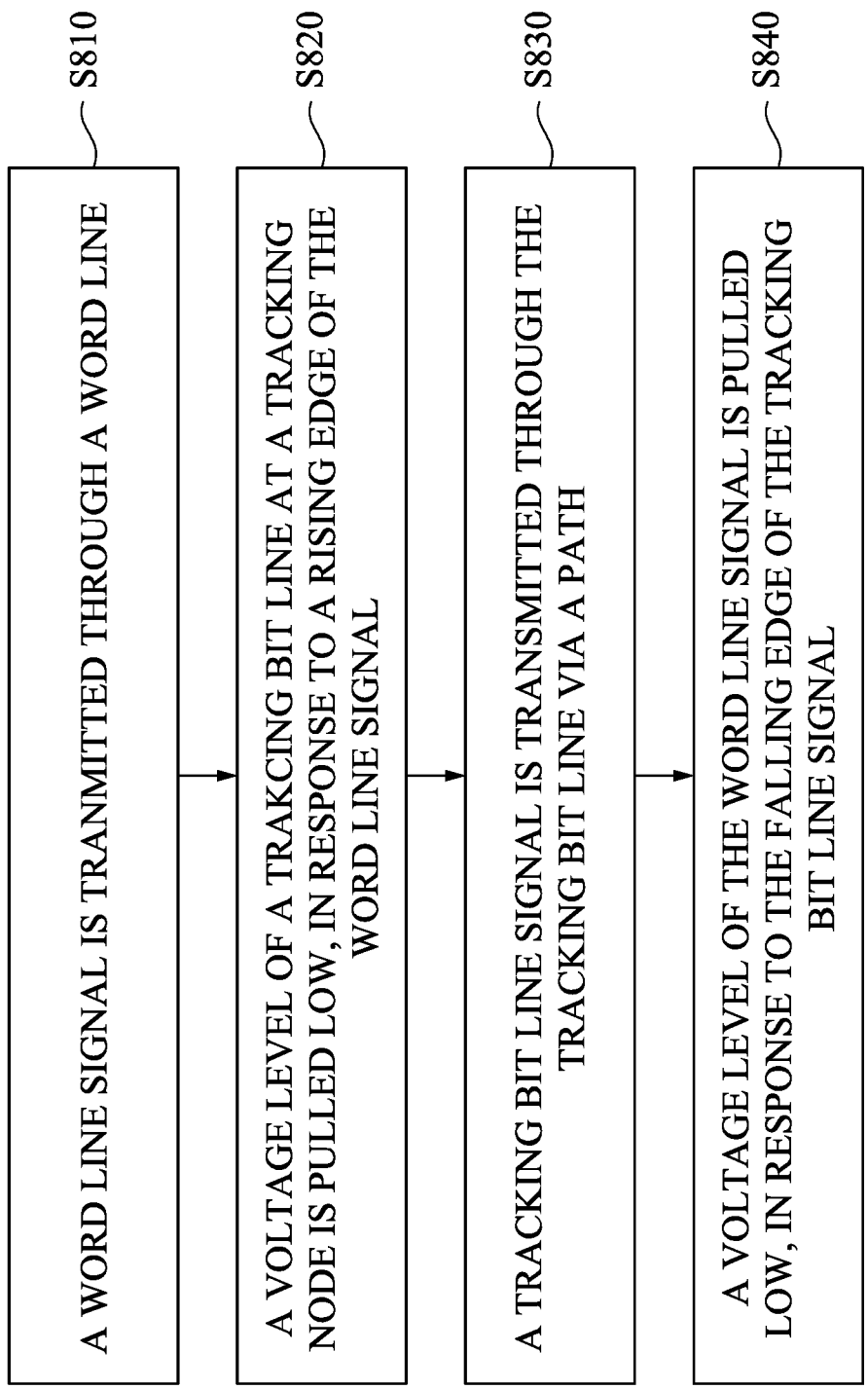
FIG. 8 is a flow chart of a method for operating a memory device corresponding to the memory device shown in FIG. 2A, in accordance with some embodiments of the present disclosure.

Reference is now made to FIG. 8. FIG. 8 is a flow chart of a method 800 for operating a memory device corresponding to the memory device 200 shown in FIG. 2A, in accordance with some embodiments of the present disclosure. In some embodiments, the memory device operated by the method 800 corresponds to at least one of the memory device 200 shown in FIG. 2A, the memory device 500 shown in FIG. 5, the memory device 600 shown in FIG. 6A, or the memory device 700 shown in FIG. 7A. Following illustrations of the method 800 in FIG. 8 with reference to the memory device 200 shown in FIG. 2A include exemplary operations. However, the operations in FIG. 8 are not necessarily performed in the order shown. Alternatively stated, operations may be added, replaced, changed order, and/or eliminated as appropriate, in accordance with the spirit and scope of various embodiments of the present disclosure.

In operation S810, a word line signal is transmitted through a word line, in response to a clock pulse signal. For illustration, as shown in FIGS. 2A-2B, when the memory cell BC00 is selected to be written or read bit data, the word line signal WL[0] is transmitted through the word line WL0, in response to the clock pulse signal CLK.

In operation S820, a voltage level of a tracking bit line at a tracking node is pulled low, in response to a rising edge of the word line signal, for generating a falling edge of a tracking bit line signal based on a resistance of a length of the tracking bit line. For illustration, as shown in FIGS. 2A-2B, a voltage level of a tracking bit line tBL at the node N1 starts to be pulled low by the first tracking cell 2110, in response to a rising edge of the word line signal WL0, for generating a falling edge of the tracking bit line signal TRKBL based on the resistance of the length, which is the length of the path P1, of the tracking bit line tBL.

In operation S830, the tracking bit line signal is transmitted through the tracking bit line via a path to a control circuit. In some embodiments, the path has a length of the tracking bit line from the tracking node to a common node coupled with the control circuit. For illustration, as shown in FIGS. 2A-2B, the tracking bit line signal TRKBL is transmitted through the tracking bit line tBL via the path P1 to the control circuit 130. The path P1 is distanced from the node N1 to the node Nc.

In operation S840, a voltage level of the word line is pulled low, in response to the falling edge of the tracking bit line signal, for generating a falling edge of the word line signal. In some embodiments, the voltage level of the word line starts to be pulled low by the control circuit, and a falling edge of the word line signal is generated. In some other embodiments, the voltage level of the word line begins to be pulled low by a word line driver which is configured to generate the word line signal and is coupled to the control circuit. For illustration, as shown in FIGS. 2A-2B, a voltage level of the word line WL0 transmitted with the word line signal WL[O] is pulled low, in response to the falling edge of the tracking bit line signal TRKBL. With such configurations, a falling edge of the word line signal WL[O] is generated accordingly.

Moreover, various circuits or devices to implement the transistors in the aforementioned embodiments are within the contemplated scope of the present disclosure. In some embodiments of this document, at least one of the transistors is implemented with at least one MOS transistor, at least one bipolar junction transistor (BJT), etc., or the combination thereof. Various circuits or devices to implement the transistors in the aforementioned embodiments are within the contemplated scope of the present disclosure.

In some embodiments, a memory device is disclosed. The memory device includes a plurality of word lines, a tracking bit line and a word line driver. The plurality of word lines are configured to transmit word line signals to memory cells. The tracking bit line is coupled to a first plurality of tracking cells that are arranged in rows. The word line driver is coupled to the plurality of word lines and a control circuit that is coupled through the tracking bit line to the plurality of word lines. The word line driver is configured to control a falling edge of each of the word line signals, by receiving corresponding each of the tracking bit line signals transmitted from the tracking bit line, based on a resistance of a length of the tracking bit line, wherein the length is substantially distanced from corresponding each of the rows to the control circuit.

In some embodiments, the memory device further includes a second plurality of tracking cells. The second plurality of tracking cells are coupled to the tracking bit line and respectively coupled to the plurality of word lines. Each of the second plurality of tracking cells is configured to pull low a voltage level of the tracking bit line for generating a falling edge of each of the tracking bit line signals, in response to a rising edge of corresponding each of the word line signals.

In some embodiments, each of the second plurality of tracking cells includes a latch circuit and a pair of transistors. The latch circuit is coupled between the pair of transistors. Gate terminals of the pair of transistors are coupled to one of the plurality of word lines. A first terminal of one of the pair of transistors is coupled to the tracking bit line.

In some embodiments, the memory device further includes a plurality of pull-down transistors. Gate terminals of the plurality of pull-down transistors are respectively coupled to the plurality of word lines. First terminals of the plurality of pull-down transistors are coupled together to the tracking bit line. Second terminals of the plurality of pull-down transistors are coupled to a reference node.

In some embodiments, the word line driver includes a plurality of decoded address lines and a second plurality of tracking cells. The plurality of decoded address lines are coupled to the plurality of word lines, and are configured to transmit decoded address line signals, for selecting one of the plurality of word lines to transmit a selected word line signal of the word line signals. The second plurality of tracking cells are respectively coupled between the tracking bit line and the plurality of decoded address lines. Each of the second plurality of tracking cells is configured to pull down a voltage level of the tracking bit line to a reference voltage level, for generating a falling edge of one of the tracking bit line signals, in response to one of the decoded address line signals.

In some embodiments, the tracking bit line is coupled to the control circuit at a common node. The second plurality of tracking cells comprising a transistor. A gate terminal of the transistor is coupled to one of the plurality of decoded address lines, and a first terminal of the transistor is coupled to the tracking bit line at a tracking node. A first tracking bit line signal of the tracking bit line signals having the pulled down voltage level is transmitted through the tracking bit line, within a tracking length from the tracking node to the common node, to the control circuit. The tracking bit line transmitted with the first tracking bit line signal has a resistance that is associated with the tracking length. The word line driver is configured to generate a falling edge of the selected word line signal, in response to the one of the tracking bit line signals.

In some embodiments, the memory device further includes a plurality of tracking word lines. The plurality of tracking word lines are coupled to the first plurality of tracking cells, and include a selected tracking word line. The selected tracking word line is coupled to a selected first tracking cell of the first plurality of tracking cells that is arranged at a selected row of the rows and is coupled to the tracking bit line at a node. The selected tracking word line is configured to transmit a tracking word line signal to the selected first tracking cell, when one of the word line signals is transmitted through one of the plurality of word lines. In response to a rising edge of the tracking word line signal, the selected first tracking cell is configured to pull low a voltage level of the tracking bit line at the node.

Also disclosed is a memory device which includes a word line driver, a tracking circuit and a control circuit. The word line driver is configured to select a first word line of word lines, for transmitting a first word line signal through the first word line to memory cells arranged at a first row. The tracking circuit is coupled to the word line driver, and includes a tracking bit line and a first plurality of tracking cells. The tracking circuit is configured to generate a first tracking bit line signal, based on a first resistance of a first length of the tracking bit line. The first length is distanced from a first tracking node to a common node. The control circuit is coupled to the word line driver and the tracking circuit, and is configured to control a pulse width of the first word line signal by triggering a falling edge of the first word line signal, in response to the first tracking bit line signal. The first tracking node is coupled with the tracking bit line and a first tracking cell of the first plurality of tracking cells, and the common node is coupled with the tracking bit line and the control circuit.

In some embodiments, the first tracking cell is arranged at the first row. A second tracking cell of the first plurality of tracking cells is arranged at a second row, and is coupled to a second word line of the word lines and coupled to the tracking bit line at a second tracking node. When the second word line is selected by the word line driver, the second tracking cell pulls low a voltage level of the second tracking node, and a second tracking bit line signal is transmitted through the tracking bit line to the control circuit. The second tracking bit line signal is associated with a second resistance of a second length of the tracking bit line. The second length is distanced from the second tracking node to the common node. The second length is different from the first length. The second resistance is different from the first resistance.

In some embodiments, the first tracking cell comprises a latch circuit, a first transistor, and a second transistor. The latch circuit is coupled between the first transistor and the second transistor, and is coupled to between a first reference node and a second reference node. Gate terminals of the first transistor and the second transistor are coupled to the first word line. The first transistor and the second transistor are configured to turn on the latch circuit, in response to a rising edge of the first word line signal.

In some embodiments, a first terminal of the first transistor is coupled to the latch circuit. A first terminal of the second transistor is coupled to the latch circuit, and a second terminal of the second transistor is coupled to the tracking bit line at the first tracking node. In response to the rising edge of the first word line signal, the turned on latch circuit is configured to pull down a voltage level of the tracking bit line to a voltage level of the second reference node.

In some embodiments, the first tracking cell comprises a pull-down transistor. A gate terminal of the pull-down transistor is coupled to the first word line, and is configured to receive the first word line signal, for activating the pull-down transistor.

In some embodiments, a first terminal of the pull-down transistor is coupled to the tracking bit line at the first tracking node. A second terminal of the pull-down transistor is coupled to a reference node. In response to a rising edge of the first word line signal, the activated pull-down transistor is configured to pull down a voltage level of the first tracking node to a voltage level of the reference node, and a delay is introduced to the first tracking bit line signal transmitted from the first tracking node to the common node. The delay is associated with the first resistance.

In some embodiments, the word line driver includes a first decoded address line. The first decoded address line is coupled to the word lines of a first group that includes the first word line. The first tracking cell comprises a first transistor. A gate terminal of the first transistor is coupled to the first decoded address line, and a first terminal of the first transistor is coupled to the tracking bit line at the first tracking node. When the first word line is selected by the first decoded address line, the first transistor is turned on for pulling low a voltage level of the first tracking node, for generating the first tracking bit line signal.

In some embodiments, the word line driver includes a second decoded address line. The second decoded address line is coupled to the word lines of a second group that is arranged next to the first group, and is coupled to a second tracking cell of the first plurality of tracking cells. The second tracking cell is arranged next to the first tracking cell and is coupled to the tracking bit line at a second tracking node. When one of the word lines of the second group is selected by the second decoded address line for transmitting a second word line signal through the selected word line of the second group to the memory cells, a voltage level of the second tracking node is pulled low by the second tracking cell, and a second tracking bit line signal is transmitted from the second tracking node through the tracking bit line to the common node. The second tracking bit line signal is associated with a second resistance of a second length of the tracking bit line. The second resistance is different from the first resistance. The control circuit is configured to control a falling edge of the second word line signal, in response to the second tracking bit line signal.

In some embodiments, the tracking circuit further includes a tracking word line and a second plurality of tracking cells. The tracking word line is coupled to the control circuit and configured to transmit a tracking word line signal. The second plurality of tracking cells are coupled to the tracking word line and the tracking bit line, and are arranged between the first plurality of tracking cells and the memory cells. When the first word line signal is generated, the tracking word line signal is generated simultaneously, in response to a clock pulse generated from the control circuit, and the tracking word line signal is transmitted through the tracking word line to one of the second plurality of tracking cells.

Also disclosed is a method which includes the operations as follows. A word line signal is transmitted through a word line. A voltage level of a tracking bit line at a tracking node is pulled low, in response to a rising edge of the word line signal, for generating a falling edge of a tracking bit line signal based on a resistance of a length of the tracking bit line. The tracking bit line signal is transmitted through the tracking bit line via a path. A voltage level of the word line signal is pulled low, in response to the falling edge of the tracking bit line signal. The path has the length of the tracking bit line from the tracking node to a common node coupled with a control circuit.

In some embodiments, the operation of pulling low the voltage level of the tracking bit line further includes the following operations. A pair of transistors are turned on. A latch circuit that is coupled between the pair of transistors is turned on, to pull down the voltage level of the tracking bit line to a reference voltage level. Gate terminals of the pair of transistors are coupled to the word line, and a terminal of the pair of transistors is coupled to the tracking bit line.

In some embodiments, the operation of pulling low the voltage level of the tracking bit line further includes the following operations. The word line signal is received by a gate terminal of a transistor. A voltage level of the tracking node is coupled from a first terminal of the transistor through a second terminal of the transistor to a reference node. The gate terminal of the transistor is coupled to the word line, and the first terminal of the transistor is coupled to the tracking bit line at the tracking node.

In some embodiments, the method further includes the following operations. A decoded address line signal is transmitted through a decoded address line to select the word line. The operation of pulling low the voltage level of the tracking bit line further includes the following operations. The decoded address line is received by a gate terminal of a transistor. A voltage level of the tracking node is coupled from a first terminal of the transistor through a second terminal of the transistor to a reference node. The gate terminal of the transistor is coupled to the decoded address line, and the first terminal of the transistor is coupled to the tracking bit line at the tracking node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of word lines configured to transmit word line signals to memory cells;
a tracking bit line coupled to a first plurality of tracking cells that are arranged in rows;
a word line driver coupled to the plurality of word lines and a control circuit that is coupled through the tracking bit line to the plurality of word lines, wherein the word line driver is configured to control a falling edge of each of the word line signals, by receiving each corresponding tracking bit line signal of tracking bit line signals transmitted from the tracking bit line, based on a resistance of a length of the tracking bit line, wherein the length is substantially distanced from each corresponding row of the rows to the control circuit; and
a second plurality of tracking cells respectively coupled to the plurality of word lines,
wherein each of the second plurality of tracking cells is configured to pull low a voltage level of the tracking bit line for generating a falling edge of each of the tracking bit line signals.

2. The memory device of claim 1,
wherein the second plurality of tracking cells is further coupled to the tracking bit line,
wherein each of the second plurality of tracking cells is configured to pull low the voltage level of the tracking bit line for generating the falling edge of each of the tracking bit line signals, in response to a rising edge of each corresponding word line signal of the word line signals.

3. The memory device of claim 2, wherein
each of the second plurality of tracking cells comprises a latch circuit and a pair of transistors,
wherein the latch circuit is coupled between the pair of transistors,
gate terminals of the pair of transistors are coupled to one of the plurality of word lines, and
a first terminal of one of the pair of transistors is coupled to the tracking bit line.

4. The memory device of claim 1, further comprising:
a plurality of pull-down transistors,
wherein gate terminals of the plurality of pull-down transistors are respectively coupled to the plurality of word lines;
first terminals of the plurality of pull-down transistors are coupled together to the tracking bit line; and
second terminals of the plurality of pull-down transistors are coupled to a reference node.

5. The memory device of claim 1, wherein the word line driver comprises:
a plurality of decoded address lines coupled to the plurality of word lines, and configured to transmit decoded address line signals, for selecting one of the plurality of word lines to transmit a selected word line signal of the word line signals; and
a second plurality of tracking cells respectively coupled between the tracking bit line and the plurality of decoded address lines,
wherein each of the second plurality of tracking cells is configured to pull down the voltage level of the tracking bit line to a reference voltage level, for generating a falling edge of one of the tracking bit line signals, in response to one of the decoded address line signals.

6. The memory device of claim 5, wherein
the tracking bit line is coupled to the control circuit at a common node,
the second plurality of tracking cells comprising a transistor,
a gate terminal of the transistor is coupled to one of the plurality of decoded address lines, and a first terminal of the transistor is coupled to the tracking bit line at a tracking node,
a first tracking bit line signal of the tracking bit line signals having the pulled down voltage level is transmitted through the tracking bit line, within a tracking length from the tracking node to the common node, to the control circuit, wherein the tracking bit line transmitted with the first tracking bit line signal has a resistance that is associated with the tracking length, and
the word line driver is configured to generate a falling edge of the selected word line signal, in response to the one of the tracking bit line signals.

7. The memory device of claim 1, further comprising:
a plurality of tracking word lines coupled to the first plurality of tracking cells, and comprising a selected tracking word line,
wherein the selected tracking word line is coupled to a selected first tracking cell of the first plurality of tracking cells that is arranged at a selected row of the rows and is coupled to the tracking bit line at a node,
the selected tracking word line is configured to transmit a tracking word line signal to the selected first tracking cell, when one of the word line signals is transmitted through one of the plurality of word lines, and
in response to a rising edge of the tracking word line signal, the selected first tracking cell is configured to pull low the voltage level of the tracking bit line at the node.

8. A memory device, comprising:
a word line driver configured to select a first word line of word lines, for transmitting a first word line signal through the first word line to memory cells arranged at a first row;
a tracking circuit coupled to the word line driver, and comprising a tracking bit line and a first plurality of tracking cells, wherein the tracking circuit is configured to generate a first tracking bit line signal, based on a first resistance of a first length of the tracking bit line, wherein the first length is distanced from a first tracking node to a common node; and
a control circuit coupled to the word line driver and the tracking circuit, and configured to control a pulse width of the first word line signal by triggering a falling edge of the first word line signal, in response to the first tracking bit line signal,
wherein the first tracking node is coupled with the tracking bit line and a first tracking cell of the first plurality of tracking cells, and the common node is coupled with the tracking bit line and the control circuit,
the word line driver comprises a first decoded address line, and the first decoded address line is coupled to the word lines of a first group that comprises the first word line,
the first tracking cell comprises a first transistor, and
a gate terminal of the first transistor is coupled to the first decoded address line, and a first terminal of the first transistor is coupled to the tracking bit line at the first tracking node.

9. The memory device of claim 8, wherein
the first tracking cell is arranged at the first row,
a second tracking cell of the first plurality of tracking cells is arranged at a second row, and is coupled to a second word line of the word lines and coupled to the tracking bit line at a second tracking node,
when the second word line is selected by the word line driver, the second tracking cell pulls low a voltage level of the second tracking node, and a second tracking bit line signal is transmitted through the tracking bit line to the control circuit,
the second tracking bit line signal is associated with a second resistance of a second length of the tracking bit line, wherein the second length is distanced from the second tracking node to the common node, and
the second length is different from the first length, and the second resistance is different from the first resistance.

10. The memory device of claim 8, wherein
the first tracking cell comprises a latch circuit, a second transistor, and a third transistor,
the latch circuit is coupled between the second transistor and the third transistor, and is coupled to between a first reference node and a second reference node,
gate terminals of the second transistor and the third transistor are coupled to the first word line, and
the second transistor and the third transistor are configured to turn on the latch circuit, in response to a rising edge of the first word line signal.

11. The memory device of claim 10, wherein
a first terminal of the second transistor is coupled to the latch circuit, a first terminal of the third transistor is coupled to the latch circuit, and a second terminal of the third transistor is coupled to the tracking bit line at the first tracking node, and in response to the rising edge of the first word line signal, the turned on latch circuit is configured to pull down a voltage level of the tracking bit line to a voltage level of the second reference node.

12. The memory device of claim 8, wherein
the first tracking cell comprises a pull-down transistor, and
a gate terminal of the pull-down transistor is coupled to the first word line, and is configured to receive the first word line signal, for activating the pull-down transistor.

13. The memory device of claim 12, wherein
a first terminal of the pull-down transistor is coupled to the tracking bit line at the first tracking node,
a second terminal of the pull-down transistor is coupled to a reference node,
in response to a rising edge of the first word line signal, the activated pull-down transistor is configured to pull down a voltage level of the first tracking node to a voltage level of the reference node, and a delay is introduced to the first tracking bit line signal transmitted from the first tracking node to the common node, and
the delay is associated with the first resistance.

14. The memory device of claim 8, wherein
when the first word line is selected by the first decoded address line, the first transistor is turned on for pulling low a voltage level of the first tracking node, for generating the first tracking bit line signal.

15. The memory device of claim 14, wherein
the word line driver comprises a second decoded address line,
the second decoded address line is coupled to the word lines of a second group that is arranged next to the first group, and is coupled to a second tracking cell of the first plurality of tracking cells,
the second tracking cell is arranged next to the first tracking cell and is coupled to the tracking bit line at a second tracking node,
when one of the word lines of the second group is selected by the second decoded address line for transmitting a second word line signal through the selected word line of the second group to the memory cells, a voltage level of the second tracking node is pulled low by the second tracking cell, and a second tracking bit line signal is transmitted from the second tracking node through the tracking bit line to the common node,
the second tracking bit line signal is associated with a second resistance of a second length of the tracking bit line, and the second resistance is different from the first resistance, and
the control circuit is configured to control a falling edge of the second word line signal, in response to the second tracking bit line signal.

16. The memory device of claim 8, wherein the tracking circuit further comprises:
a tracking word line coupled to the control circuit and configured to transmit a tracking word line signal; and a second plurality of tracking cells coupled to the tracking word line and the tracking bit line, and arranged between the first plurality of tracking cells and the memory cells,
wherein when the first word line signal is generated, the tracking word line signal is generated simultaneously, in response to a clock pulse generated from the control circuit, and the tracking word line signal is transmitted through the tracking word line to one of the second plurality of tracking cells.

17. A method, comprising:
transmitting a word line signal through a word line;
pulling low a voltage level of a tracking bit line at a tracking node, in response to a rising edge of the word line signal, for generating a falling edge of a tracking bit line signal based on a resistance of a length of the tracking bit line;
transmitting the tracking bit line signal through the tracking bit line via a path; and
pulling low a voltage level of the word line, in response to the falling edge of the tracking bit line signal, for generating a falling edge of the word line signal,
wherein the path has the length of the tracking bit line from the tracking node to a common node coupled with a control circuit, and
pulling low the voltage level of the tracking bit line further comprises:
turning on a latch circuit to pull down the voltage level of the tracking bit line to a reference voltage level.

18. The method of claim 17, wherein pulling low the voltage level of the tracking bit line further comprises:
turning on a pair of transistors;
wherein the latch circuit is coupled between the pair of transistors,
wherein gate terminals of the pair of transistors are coupled to the word line, and a terminal of the pair of transistors is coupled to the tracking bit line.

19. The method of claim 17, wherein pulling low the voltage level of the tracking bit line further comprises:
receiving the word line signal by a gate terminal of a transistor; and
coupling a voltage level of the tracking node from a first terminal of the transistor through a second terminal of the transistor to a reference node,
wherein the gate terminal of the transistor is coupled to the word line, and the first terminal of the transistor is coupled to the tracking bit line at the tracking node.

20. The method of claim 17, further comprising:
transmitting a decoded address line signal through a decoded address line to select the word line,
wherein pulling low the voltage level of the tracking bit line further comprises:
receiving the decoded address line by a gate terminal of a transistor; and
coupling a voltage level of the tracking node from a first terminal of the transistor through a second terminal of the transistor to a reference node,
wherein the gate terminal of the transistor is coupled to the decoded address line, and the first terminal of the transistor is coupled to the tracking bit line at the tracking node.

* * * * *